(12) United States Patent
Kumamoto et al.

(10) Patent No.: US 10,663,793 B2
(45) Date of Patent: May 26, 2020

(54) IMAGE DISPLAY DEVICE

(71) Applicant: Panasonic Intellectual Property Management Co., Ltd., Osaka (JP)

(72) Inventors: Yasuhiro Kumamoto, Osaka (JP); Takeichi Shinya, Osaka (JP); Koujirou Higa, Osaka (JP); Masaaki Ofuji, Osaka (JP); Taizou Takeuchi, Osaka (JP); Tadahiro Kugimaru, Osaka (JP); Ryou Shimotaya, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 60 days.

(21) Appl. No.: 15/754,208

(22) PCT Filed: Aug. 30, 2016

(86) PCT No.: PCT/JP2016/003945
§ 371 (c)(1),
(2) Date: Feb. 21, 2018

(87) PCT Pub. No.: WO2017/038085
PCT Pub. Date: Mar. 9, 2017

(65) Prior Publication Data
US 2018/0252966 A1 Sep. 6, 2018

(30) Foreign Application Priority Data

Sep. 1, 2015 (JP) .................. 2015-172363
Mar. 10, 2016 (JP) .................. 2016-047073

(51) Int. Cl.
*G02F 1/1335* (2006.01)
*F21V 23/06* (2006.01)
(Continued)

(52) U.S. Cl.
CPC .......... *G02F 1/133603* (2013.01); *F21S 2/00* (2013.01); *F21V 19/00* (2013.01);
(Continued)

(58) Field of Classification Search
CPC .... G02F 1/133603; H05K 2201/09136; H05K 1/0271
See application file for complete search history.

(56) References Cited

U.S. PATENT DOCUMENTS 6,362,801 B1   3/2002  Yuhara
2003/0072153 A1  4/2003  Matsui et al.
(Continued)

FOREIGN PATENT DOCUMENTS

EP     2090924 A2   8/2009
EP     2184634 A2   5/2010
(Continued)

OTHER PUBLICATIONS

Final Office Action issued in U.S. Appl. No. 15/750,881, dated Apr. 30, 2019.
(Continued)

*Primary Examiner* — Alexander P Gross
(74) *Attorney, Agent, or Firm* — McDermott Will & Emery LLP

(57) ABSTRACT

A video display device includes a liquid crystal display panel, and light source substrates configured to illuminate the liquid crystal display panel from a rear side of the liquid crystal display panel. Each of the light source substrates includes a plurality of light emitting diodes each of which is provided in corresponding one of areas different from each other in the liquid crystal display panel, and driver elements which drive each of the plurality of light emitting diodes such that light is emitted with luminance corresponding to brightness within a corresponding area of an image in
(Continued)

accordance with a control signal. First conductive foil is disposed on a first main surface of the light source substrate on which the light emitting diodes are provided. Second conductive foil is disposed on a second main surface of the light source substrate on a side opposite to the first main surface. Ground pattern foil is disposed as the second conductive foil on the second main surface in regions each of which includes a corresponding one of the plurality of light emitting diodes in a plan view. The first conductive foil and the second conductive foil have a substantially equivalent area.

15 Claims, 16 Drawing Sheets

(51) Int. Cl.
*G09G 3/36* (2006.01)
*G09G 3/34* (2006.01)
*G09F 9/00* (2006.01)
*H05K 1/02* (2006.01)
*F21V 23/00* (2015.01)
*F21S 2/00* (2016.01)
*F21V 19/00* (2006.01)
*G09G 3/20* (2006.01)
*G02F 1/133* (2006.01)
*G02F 1/1333* (2006.01)
*G02F 1/13357* (2006.01)

(52) U.S. Cl.
CPC .............. *F21V 23/00* (2013.01); *F21V 23/06* (2013.01); *G02F 1/13306* (2013.01); *G02F 1/133308* (2013.01); *G09F 9/00* (2013.01); *G09G 3/20* (2013.01); *G09G 3/34* (2013.01); *G09G 3/36* (2013.01); *H05K 1/0209* (2013.01); *H05K 1/0263* (2013.01); *H05K 1/0271* (2013.01); *G02F 2001/133601* (2013.01); *G02F 2001/133612* (2013.01); *G02F 2001/133628* (2013.01); *H05K 2201/09136* (2013.01); *H05K 2201/09672* (2013.01); *H05K 2201/10106* (2013.01); *H05K 2201/10136* (2013.01)

(56) References Cited

U.S. PATENT DOCUMENTS

| 2004/0125269 | A1 | 7/2004 | Kim et al. | |
|---|---|---|---|---|
| 2004/0239829 | A1 | 12/2004 | Yu et al. | |
| 2005/0265051 | A1 | 12/2005 | Yamamoto et al. | |
| 2006/0092346 | A1 | 5/2006 | Moon et al. | |
| 2007/0242477 | A1 | 10/2007 | Yoo et al. | |
| 2008/0143916 | A1 | 6/2008 | Fujino et al. | |
| 2009/0003002 | A1 | 1/2009 | Sato | |
| 2009/0021932 | A1 | 1/2009 | Kim et al. | |
| 2009/0121652 | A1 | 5/2009 | Kang et al. | |
| 2009/0135331 | A1 | 5/2009 | Kawase | |
| 2009/0167194 | A1 | 7/2009 | Mizuta | |
| 2009/0201441 | A1 | 8/2009 | Laney et al. | |
| 2009/0302780 | A1 | 12/2009 | Kim et al. | |
| 2009/0309498 | A1 | 12/2009 | Park et al. | |
| 2009/0310335 | A1 | 12/2009 | Park | |
| 2010/0066752 | A1 | 3/2010 | Watanuki | |
| 2010/0109562 | A1 | 5/2010 | Shen et al. | |
| 2010/0156955 | A1 | 6/2010 | Kimura | |
| 2011/0019126 | A1* | 1/2011 | Choi | H05K 1/0206 349/61 |
| 2011/0050111 | A1 | 3/2011 | Tanaka et al. | |
| 2011/0063850 | A1 | 3/2011 | Oide et al. | |
| 2011/0304798 | A1 | 12/2011 | Tanaka et al. | |
| 2011/0310590 | A1 | 12/2011 | Yamashita et al. | |
| 2012/0019490 | A1 | 1/2012 | Huang | |
| 2012/0087122 | A1 | 4/2012 | Takeuchi et al. | |
| 2012/0139445 | A1 | 6/2012 | Fujiwara et al. | |
| 2012/0212682 | A1 | 8/2012 | Kuromizu | |
| 2012/0218752 | A1 | 8/2012 | Sumitani | |
| 2012/0293724 | A1 | 11/2012 | Ueyama | |
| 2013/0069560 | A1 | 3/2013 | Kurita | |
| 2013/0094187 | A1 | 4/2013 | Kamada | |
| 2013/0229596 | A1* | 9/2013 | Hosoki | F21V 21/00 349/65 |
| 2014/0211123 | A1 | 7/2014 | Lee et al. | |

FOREIGN PATENT DOCUMENTS

| EP | 2492742 A1 | 8/2012 |
|---|---|---|
| EP | 3318792 A1 | 5/2018 |
| EP | 3318793 A1 | 5/2018 |
| JP | 2001-338505 A | 12/2001 |
| JP | 2005-109228 A | 4/2005 |
| JP | 2006-128125 A | 5/2006 |
| JP | 2007-322697 A | 12/2007 |
| JP | 2008-166304 A | 7/2008 |
| JP | 2008-270144 A | 11/2008 |
| JP | 2009-032593 A | 2/2009 |
| JP | 2009-140720 A | 6/2009 |
| JP | 2009-162952 A | 7/2009 |
| JP | 2009-222793 A | 10/2009 |
| JP | 2011-034949 A | 2/2011 |
| JP | 2011-090949 A | 5/2011 |
| JP | 2012-004067 A | 1/2012 |
| JP | 2012-089509 A | 5/2012 |
| JP | 2012-119436 | 6/2012 |
| JP | 2012-174634 A | 9/2012 |
| JP | 2012-204337 A | 10/2012 |
| JP | 2012-212509 A | 11/2012 |
| JP | 2013-182076 | 9/2013 |
| JP | 2013-246988 A | 12/2013 |
| JP | 2014-041830 | 3/2014 |
| JP | 2014-067679 A | 4/2014 |
| JP | 2014-149529 A | 8/2014 |
| WO | 2008/156020 A1 | 12/2008 |
| WO | 2010/101062 A1 | 9/2010 |
| WO | 2011/058903 A1 | 5/2011 |

OTHER PUBLICATIONS

Non-Final Office Action issued in U.S. Appl. No. 15/750,886, dated Mar. 21, 2019.
Non-Final Office Action issued in U.S. Appl. No. 15/750,871, dated Jun. 13, 2019.
The Extended European Search Report dated Jun. 19, 2018 for the related European Patent Application No. 16841114.8.
The Extended European Search Report dated Jun. 26, 2018 for the related European Patent Application No. 16841115.5.
The Extended European Search Report dated Jun. 22, 2018 for the related European Patent Application No. 16841116.3.
The Extended European Search Report dated Jun. 28, 2018 for the related European Patent Application No. 16841117.1.
The Extended European Search Report dated Jun. 14, 2018 for the related European Patent Application No. 16841118.9.
The Partial Supplementary European Search Report dated Jun. 27, 2018 for the related European Patent Application No. 16841119.7.
International Search Report of PCT application No. PCT/JP2016/003945 dated Nov. 22, 2016.
Non-Final Office Action issued in U.S. Appl. No. 15/750,883, dated Jan. 9, 2019.
Non-Final Office Action issued in U.S. Appl. No. 15/750,874, dated Dec. 13, 2018.
Non-Final Office Action issued in U.S. Appl. No. 15/750,871, dated Jan. 2, 2019.
Non-Final Office Action issued in U.S. Appl. No. 15/750,881, dated Oct. 4, 2018.
International Search Report of PCT application No. PCT/JP2016/003939 dated Nov. 22, 2016.
International Search Report of PCT application No. PCT/JP2016/003941 dated Nov. 8, 2016.

(56) References Cited

OTHER PUBLICATIONS

International Search Report of PCT application No. PCT/JP2016/003942 dated Nov. 22, 2016.
International Search Report of PCT application No. PCT/JP2016/003940 dated Nov. 8, 2016.
The Extended European Search Report dated Sep. 24, 2018 for the related European Patent Application No. 16841119.7.
Final Office Action issued in U.S. Appl. No. 15/750,883, dated Jul. 1, 2019.
Notice of Allowance issued in U.S. Appl. No. 15/750,883, dated Sep. 3, 2019.
Non-Final Office Action issued in U.S. Appl. No. 15/750,886, dated Aug. 8, 2019.
The EPC Office Action dated Jan. 13, 2020 for the related European Patent Application No. 16841115.5.

\* cited by examiner

FIG. 13
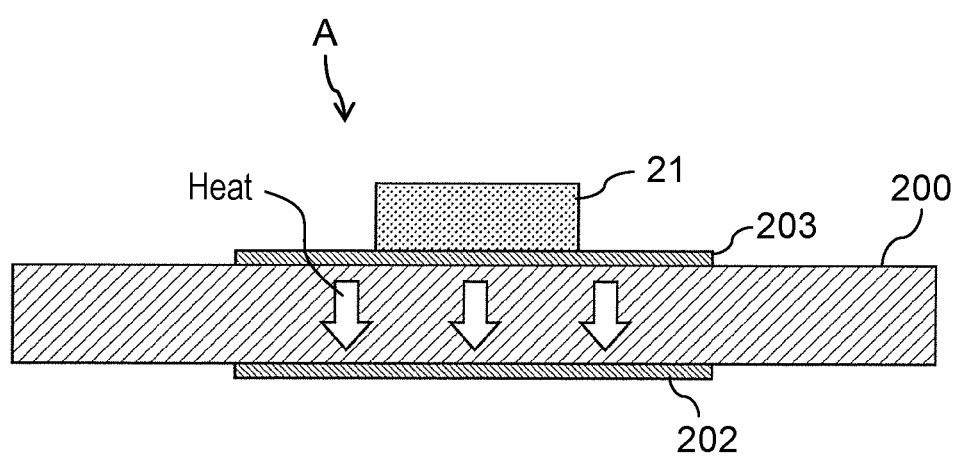
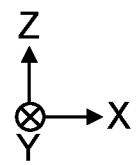

IMAGE DISPLAY DEVICE

CROSS-REFERENCE TO RELATED APPLICATIONS

This application is a U.S. national stage application of the PCT International Application No. PCT/JP2016/003945 filed on Aug. 30, 2016, which claims the benefit of foreign priority of Japanese patent applications No. 2015-172363 filed on Sep. 1, 2015 and No. 2016-047073 filed on Mar. 10, 2016, the contents all of which are incorporated herein by reference.

TECHNICAL FIELD

The present disclosure relates to a video display device including a backlight.

BACKGROUND ART

For example, various technologies for improving quality of images formed by a video display device including a backlight, such as a liquid crystal display device, have been developed. A technology called local dimming is one of examples of these technologies.

Patent Literature 1 discloses a technology relating to local dimming. Local dimming is a technology which divides a liquid crystal display panel into a plurality of areas, and dims each of a plurality of light sources disposed in corresponding one of the areas in accordance with brightness of an image formed in the corresponding area of the liquid crystal display panel. This technology can increase contrast of images within one screen. Each of the light sources is constituted by a light emitting diode (LED), for example.

CITATION LIST

Patent Literature

PTL 1: Unexamined Japanese Patent Publication No. 2014-41830

SUMMARY

According to the video display device performing local dimming, it is effective to provide a larger number of LEDs capable of independently dimming and achieving partial finer control of a backlight based on an image for accurate contrast increase within a screen.

However, the video display device which independently dims numerous LEDs requires numerous substrates and cables corresponding to the numerous LEDs. This increase in the number of the substrates and cables may become an obstacle to reduction in size and thickness of the video display device, or may raise assembly cost of the video display device. In addition, appropriate control of heat generated from the numerous LEDs and driver elements is needed.

The present disclosure provides a video display device which includes a plurality of LEDs capable of independently dimming, and can achieve reduction in size, thickness, and assembly cost of the device, and appropriate control of heat.

A video display device according to an aspect of the present disclosure includes a liquid crystal display panel, and a light source substrate configured to illuminate the liquid crystal display panel from a rear side of the liquid crystal display panel. The light source substrate includes a plurality of light emitting diodes each of which is provided in corresponding one of areas different from each other in the liquid crystal display panel, and further includes driver elements which drive each of the plurality of light emitting diodes such that light is emitted with luminance corresponding to brightness within a corresponding area of an image in accordance with a control signal. The light source substrate includes a first main surface on which the light emitting diodes are provided, and a second main surface on a side opposite to the first main surface. First conductive foil is disposed on the first main surface, while second conductive foil is disposed on the second main surface. Ground pattern foil is disposed as the second conductive foil on the second main surface in regions each of which includes a corresponding one of the plurality of light emitting diodes in a plan view. In this case, the first conductive foil and the second conductive foil have a substantially equivalent area.

According to the video display device of the present disclosure, the plurality of light emitting diodes and the plurality of driver elements are provided on one light source substrate. Accordingly, reduction of substrates and cables, and therefore reduction in size, thickness, and assembly cost of the device can be achieved. Moreover, the ground pattern foil is disposed on the second main surface of the light source substrate in regions each of which includes corresponding one of the light emitting diodes. Accordingly, heat generated from the light emitting diodes can be efficiently dissipated to the outside. Furthermore, the conductive foil provided on the first main surface of the light source substrate and the conductive foil provided on the second main surface of the light source substrate have substantially an equivalent area. Accordingly, preferable heat dissipation and reduction of a bend of the light source substrate can be both achieved.

BRIEF DESCRIPTION OF DRAWINGS

FIG. 13 is a cross-sectional view schematically illustrating an example of a structure of the light source substrate included in the video display device according to the third exemplary embodiment.

DESCRIPTION OF EMBODIMENTS

Figure 1:
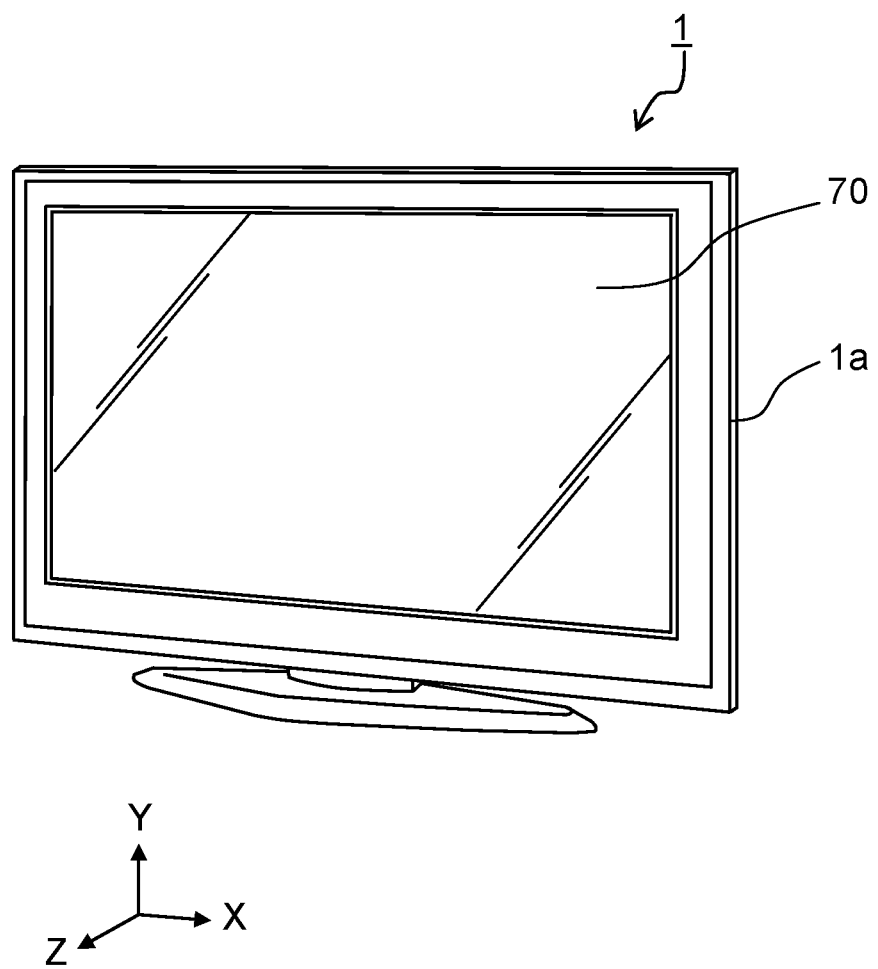
FIG. 1 is a view schematically illustrating an example of an external appearance of a video display device according to a first exemplary embodiment.

A video display device according to an aspect of the present disclosure includes a liquid crystal display panel, and a light source substrate configured to illuminate the liquid crystal display panel from a rear side of the liquid crystal display panel. The light source substrate includes a plurality of light emitting diodes each of which is provided in corresponding one of areas different from each other in the liquid crystal display panel, and further includes driver elements which drive each of the plurality of light emitting diodes such that light is emitted with luminance corresponding to brightness within a corresponding area of an image in accordance with a control signal. The light source substrate includes a first main surface on which the light emitting diodes are provided, and a second main surface on a side opposite to the first main surface. First conductive foil is disposed on the first main surface, while second conductive foil is disposed on the second main surface. Ground pattern foil is disposed as the second conductive foil on the second main surface in regions each of which includes a corresponding one of the plurality of light emitting diodes in a plan view. In this case, the first conductive foil and the second conductive foil have a substantially equivalent area.

According to this configuration, the plurality of light emitting diodes and the plurality of driver elements are provided on one light source substrate. Accordingly, reduction of substrates and cables, and therefore reduction in size, thickness, and assembly cost of the device can be achieved. Moreover, the ground pattern foil is disposed on the second main surface of the light source substrate in the regions including the light emitting diodes. Accordingly, heat generated from the light emitting diodes can be efficiently dissipated to the outside. Heat dissipation improves as the ground pattern foil on the second main surface becomes wider. However, the light source substrate more easily bends as an area difference between the ground pattern foil and the conductive foil on the first main surface increases. According to the light source substrate in this aspect, however, the conductive foil disposed on the first main surface and the conductive foil disposed on the second main surface have a substantially equivalent area. Accordingly, preferable heat dissipation and reduction of a bend of the light source substrate can be both achieved.

A video display device according to another aspect of the present disclosure includes a liquid crystal display panel, a base plate made of metal, and a light source substrate attached to the base plate and configured to illuminate the liquid crystal display panel from a rear side of the liquid crystal display panel. The light source substrate includes a plurality of light emitting diodes each of which is provided in a corresponding one of areas different from each other in the liquid crystal display panel, and further includes driver elements which drive each of the plurality of light emitting diodes such that light is emitted with luminance corresponding to brightness within a corresponding area of an image in accordance with a control signal. The light source substrate includes a first main surface on which the light emitting diodes are provided, and a second main surface on a side opposite to the first main surface. First conductive foil is disposed on the first main surface, while second conductive foil is disposed on the second main surface. At least a part of the second conductive foil is constituted by ground pattern foil electrically connected to the base plate.

According to this configuration, the plurality of light emitting diodes and the plurality of driver elements are provided on one light source substrate. Accordingly, reduction of substrates and cables, and therefore reduction in size, thickness, and assembly cost of the device can be achieved. In addition, the ground pattern foil on the second main surface is connected to the base plate to use the base plate as a part of a ground line. Accordingly, reduction of an area of the ground pattern foil provided on the light source substrate can be achieved. This reduction of the area of the ground pattern foil can produce an area for power supply pattern foil on the first main surface, for example, when the ground pattern foil on the first main surface is reduced. A voltage drop in a power supply line decreases as power supply pattern foil becomes wider. Accordingly, this configuration can achieve reduction of a power supply voltage. Moreover, heat generation (heat loss) of the driver elements decreases with reduction of the power supply voltage.

In addition, 90% or more of the first conductive foil in an area ratio may be constituted by power supply pattern foil.

According to this configuration, most of the first conductive foil on the first main surface functions as power supply pattern foil. In this case, a voltage drop in a power supply line decreases, wherefore reduction of the power supply voltage for driving the light emitting diodes can be realized. Moreover, heat generation (heat loss) of the driver elements decreases with reduction of the power supply voltage.

In addition, the light source substrate may be attached to the base plate via a fastening member made of metal. The ground pattern foil may be electrically connected to the base plate via the fastening member.

According to this configuration, the base plate functioning as a rigid base for supporting the light source substrate is allowed to function as a part of a ground line. When the base plate having relatively low electrical resistance is used as a part of the ground line, a voltage drop in the ground line decreases. Accordingly, reduction of the power supply voltage for driving the light emitting diodes can be realized. Moreover, heat generation (heat loss) of the driver elements decreases with reduction of the power supply voltage.

In addition, the light source substrate may include a plurality of power source connectors connected to the first conductive foil at positions different from each other.

According to this configuration, the first conductive foil included in the light source substrate functions as a part of a power supply line for supplying power to a plurality of the light source substrates when the power source connectors of the adjacent ones of the light source substrates are connected to each other. More specifically, power is supplied to the plurality of light source substrates connected by cascade connection. In this case, the number of cables can decrease in comparison with the number of cables in a configuration including a plurality of light source substrates not connected by cascade connection.

In addition, the driver elements may be provided on the first main surface.

According to this configuration, the light emitting diodes and the driver element are provided on the first main surface of the light source substrate. Accordingly, a process for providing members on the light source substrate in a manufacturing step is more facilitated than in such a case when these members are provided on both surfaces. A reflection plate is provided on the first main surface of the light source substrate to guide light toward corresponding areas from each of the light emitting diodes. This reflection plate may include protrusions functioning as partitions to reduce light leakage between areas associated with the adjacent ones of the light emitting diodes. When these protrusions are hollow and store the driver elements, non-uniformity of luminance caused by interference between the driver elements and the reflection sheet can be prevented. In addition, the driver elements can be provided on each of the light source substrates while effectively utilizing spaces inside the protrusions.

Exemplary embodiments are hereinafter described in detail with reference to the drawings as necessary. However, excessive details may be omitted in the following description. For example, detailed description of well-known matters, and repetitive description of substantially identical configurations may be omitted. This omission is made for avoiding excessive redundancy of the following description, and facilitating understanding by those skilled in the art.

Note that each of the exemplary embodiments described herein is only presented as a specific example of the present disclosure. Numerical values, shapes, materials, constituent elements, and positions and connection manners of the constituent elements included in the following exemplary embodiments are presented by way of example, and not intended to limit the subject matters of the present disclosure. In addition, constituent elements included in the following exemplary embodiments and not contained in the independent claims defining the highest concepts are described as optional constituent elements.

Note that the accompanying drawings and the following description are presented to help those skilled in the art fully understand the present disclosure. It is therefore not intended that the subject matters defined in the appended claims be limited to those drawings and description.

Moreover, the respective figures are schematic views and not necessarily precise depictions. Furthermore, substantially identical constituent elements in the respective figures have been given identical reference numbers. Description of these elements are omitted or simplified in some cases.

First Exemplary Embodiment

Video display device 1 according to a first exemplary embodiment is hereinafter described with reference to FIGS. 1 through 8. It is assumed that three axes of X axis, Y axis, and Z axis are defined in the respective figures in this exemplary embodiment. The X axis is an axis extending in a direction in parallel with a long side of a liquid crystal display panel. The Y axis is an axis extending in a direction in parallel with a short side of the liquid crystal display panel. The Z axis is an axis perpendicular to both the X and Y axes. However, these axes are defined only for convenience and not intended to limit the present disclosure.

[1-1. Configuration]

Video display device 1 according to the first exemplary embodiment includes a liquid crystal display panel, and light source substrates for illuminating the liquid crystal display panel from a rear side of the liquid crystal display panel. Video display device 1 is presented as an example of a video display device. Each of the light source substrates includes a plurality of LEDs each of which is provided in corresponding one of areas different from each other in the liquid crystal display panel, and further includes driver elements which drive (dim) each of the plurality of LEDs such that light is emitted with luminance corresponding to brightness within the corresponding area of an image in accordance with a control signal. Note that brightness within the corresponding area of an image in this context refers to brightness of the image in the area of the liquid crystal display panel illuminated by one LED (or LED disposed in one portion) (i.e., partial brightness of the image in the area corresponding to the LED).

FIG. 1 is a view schematically illustrating an example of an external appearance of video display device 1 according to the first exemplary embodiment.

As illustrated in FIG. 1, video display device 1 has an external appearance of an ordinary flat panel display, and includes liquid crystal display panel 70 and light source substrates (not shown in FIG. 1). Display panel 70 and the light source substrates are stored in housing 1a having an opened front surface. According to this exemplary embodiment, surfaces of video display device 1 and respective constituent members of video display device 1 on the side facing a user (surfaces on the side illustrated in FIG. 1) are referred to as front surfaces, while surfaces on the side opposite to the front surfaces (back surfaces) are referred to as rear surfaces.

Figure 2:
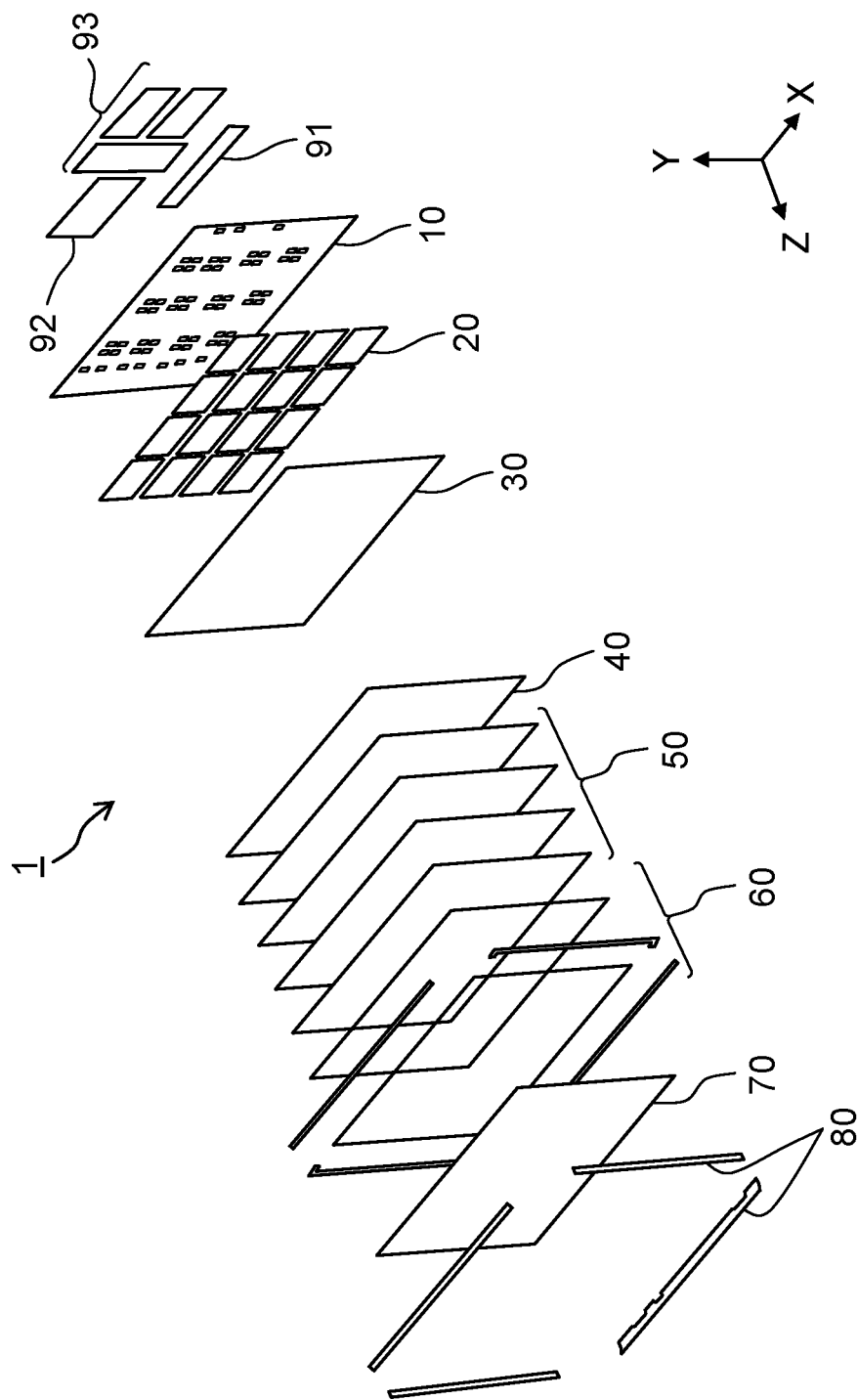
FIG. 2 is an exploded perspective view schematically illustrating an example of a configuration of the video display device according to the first exemplary embodiment.

FIG. 2 is an exploded perspective view schematically illustrating an example of a configuration of video display device 1 according to the first exemplary embodiment.

As illustrated in FIG. 2, video display device 1 includes base plate 10, a plurality of light source substrates 20, reflection sheet 30, flatter 40, various types of optical sheets 50, mold frame 60, liquid crystal display panel 70, bezel 80, connection terminal substrate 91, signal processing substrate 92, and power supply substrate 93. These members are stored in housing 1a (see FIG. 1) to constitute video display device 1. Note that video display device 1 further includes a support member, a fastening member, a reinforcing member and the like not shown in the figures, besides the foregoing members.

Base plate 10 is a base to which light source substrates 20, connection terminal substrate 91, signal processing substrate 92, and power supply substrate 93 are attached. Base plate 10 is made of sheet metal, for example. Accordingly, base plate 10 is made of metal. Screw holes, openings described below, and others are provided in base plate 10.

Light source substrates 20 constitute a backlight module illuminating liquid crystal display panel 70. Each of light source substrates 20 includes a plurality of LEDs, and a plurality of driver elements for driving each of the plurality of LEDs. The plurality of light source substrates 20 may have a uniform shape. Light source substrate 20 will be detailed below.

Each of the plurality of light source substrates 20 is attached to a front surface of base plate 10 (surface on the side toward liquid crystal display panel 70) of video display device 1. According to video display device 1, the plurality of light source substrates 20 thus provided constitute a backlight to illuminate liquid crystal display panel 70.

Reflection sheet 30 is disposed on the front surfaces of light source substrates 20 (surfaces on the side toward liquid crystal display panel 70). Reflection sheet 30 includes openings through which LEDs (LEDs 21 of light source substrates 20 illustrated in FIG. 3) penetrate. Reflection sheet 30 is a sheet configured such that a part of light emitted from the LEDs and reflected on reflection sheet 30 travels toward liquid crystal display panel 70. Reflection sheet 30 is made of white synthetic resin, for example, but may be made of other white materials. Hhollow protrusions having a protruding shape toward the front side (toward liquid crystal display panel 70) for separating the adjacent ones of the LEDs are formed in reflection sheet 30 (see FIG. 4). In this case, each periphery of the LEDs is surrounded by the corresponding protrusions, wherefore each of the LEDs illuminates an area surrounded by the corresponding protrusions around the LED. Reflection sheet 30 will be detailed below.

Flatter 40 is an optical sheet disposed on the front surface of reflection sheet 30 (surface on the side toward liquid crystal display panel 70) to improve uniformity of luminance in each of the areas illuminated by the corresponding LEDs (areas surrounded by the protrusions of reflection sheet 30). Flatter 40 transmits light emitted from the LEDs not uniformly, but with distribution of light transmittance (hereinafter also abbreviated as "transmittance") produced in each of the areas illuminated by the LEDs. Note that distribution of transmittance in this exemplary embodiment refers to a state of a presence of distribution containing relatively high-transmittance portions and relatively low-transmittance portions. Flatter 40 is made of synthetic resin, for example, but may be made of other materials. When flatter 40 is absent, variations in luminance (luminance distribution) may be produced in each of the areas illuminated by the LEDs of light source substrates 20 in a state that each of the LEDs of light source substrates 20 is a point light source constituted by the LED. Flatter 40 is configured to produce transmittance distribution capable of canceling the luminance distribution in each area. Accordingly, uniformity of luminance in each of the areas illuminated by the LEDs can improve. Flatter 40 will be detailed below.

Optical sheets 50 are sheets having various types of optical functions other than the function of flatter 40. For example, optical sheets 50 include a diffusion plate which diffuses light to further increase uniformity of luminance, a prism sheet which equalizes traveling routes of light into a frontward direction to increase luminance visually recognized by the user, and others. For example, optical sheets 50 may be constituted by synthesis resin on which surfaces fine shapes corresponding to respective functions are formed.

Mold frame 60 is a support member which supports an outer periphery of liquid crystal display panel 70 from the rear surface. Mold frame 60 is made of synthetic resin, for example, but may be made of other materials. In addition, mold frame 60 may be fixed to base plate 10.

Liquid crystal display panel 70 is a liquid crystal display panel for image display, including a plurality of liquid crystal pixels arranged in matrix.

Bezel 80 is a support member which supports the outer periphery of liquid crystal display panel 70 from the front surface. Bezel 80 is made of metal, for example, but may be made of synthetic resin.

Connection terminal substrate 91 is a circuit substrate which includes terminals and an interface circuit for receiving image signals. Signal processing substrate 92 is a circuit substrate which includes a signal processing circuit for processing image signals. Signal processing substrate 92 further includes a circuit which generates control signals for controlling (dimming) luminance of the LEDs of light source substrates 20 based on image signals. Power supply substrate 93 is a circuit substrate which includes a power supply circuit for supplying operation power (hereinafter also abbreviated as "power") to video display device 1. Connection terminal substrate 91, signal processing substrate 92, and power supply substrate 93 are attached to the rear surface of base plate 10.

Light source substrates 20 are hereinafter described.

Figure 3:
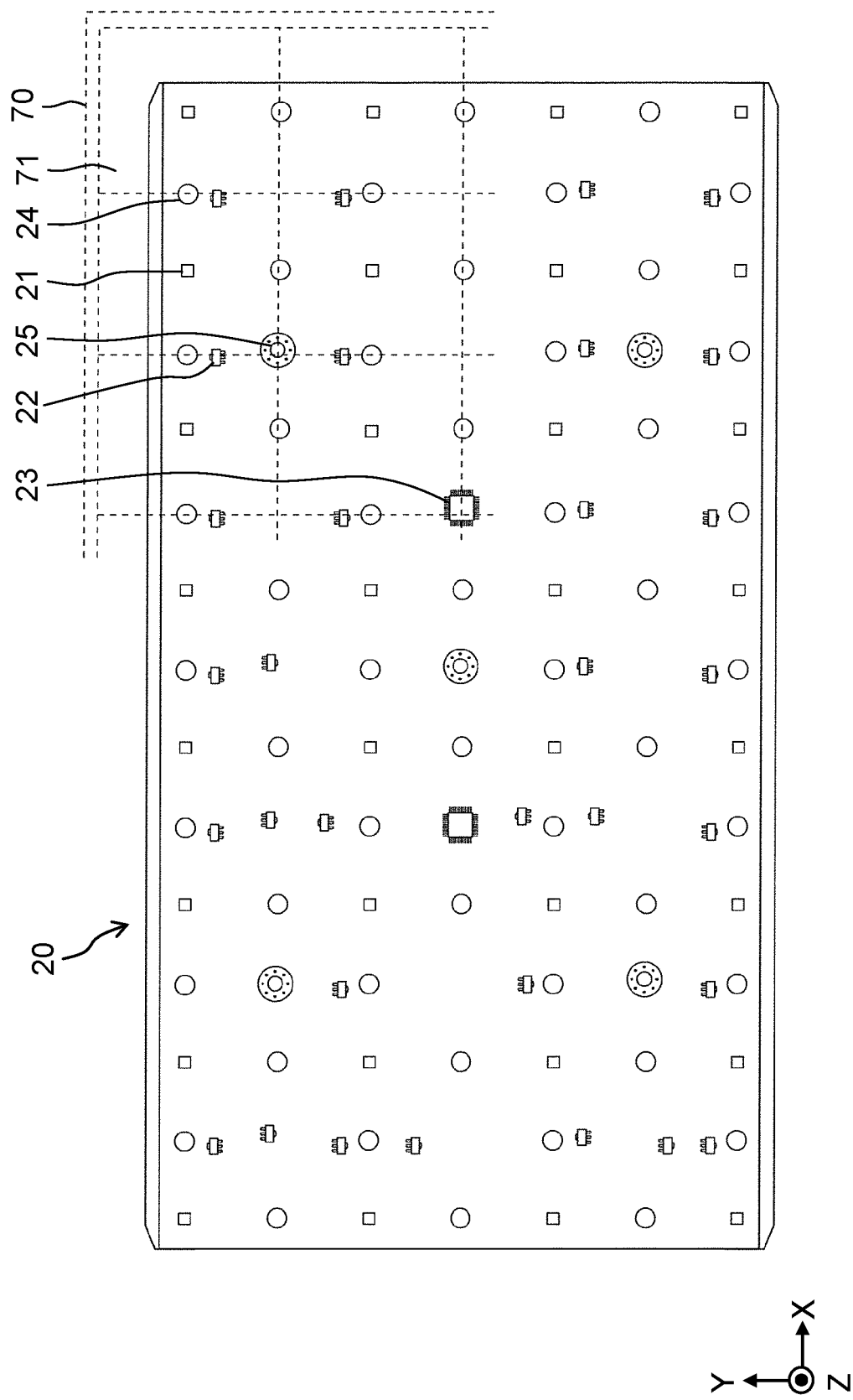
FIG. 3 is a plan view schematically illustrating an example of a configuration of a light source substrate included in the video display device according to the first exemplary embodiment.

FIG. 3 is a plan view schematically illustrating an example of a configuration of each of light source substrates 20 included in video display device 1 according to the first exemplary embodiment. Note that FIG. 3 illustrates an example of respective members disposed on the front surface of light source substrate 20. In addition, positions corresponding to areas 71 of liquid crystal display panel 70 illuminated by respective LEDs 21 are indicated by broken lines in a part of FIG. 3 for convenience to facilitate visual understanding.

As illustrated in FIG. 3, the plurality of LEDs 21, and the plurality of driver elements 22 and driver elements 23 are provided on light source substrate 20.

Each of LEDs 21 is provided on corresponding one of areas 71 different from each other in liquid crystal display panel 70. According to video display device 1 of this exemplary embodiment, each of LEDs 21 is constituted by a high-voltage LED. The high-voltage LED in this context, for example, refers to an LED constituted by a plurality of LED elements (i.e., a plurality of pn junctions) connected in series. The high-voltage LED is an LED to which higher voltage is applicable than a single LED element (low-voltage LED). Moreover, when higher voltage is applied, the high-voltage LED can provide higher light emission luminance than a single LED element in a state of flow of substantially the same current.

Each of driver elements 22 and driver elements 23 is a semiconductor element for driving LEDs 21 based on a control signal supplied from signal processing substrate 92. Each of driver elements 22 and driver elements 23 receives a control signal indicating luminance of light emitted from respective LEDs 21. In this case, driver element 22 and driver element 23 drive (dim) corresponding LED 21 in accordance with the control signal such that light is emitted with luminance corresponding to brightness of corresponding area 71 of an image. Each of driver elements 22 may be constituted by a metal-oxide semiconductor (MOS) transistor, for example. In addition, each of driver elements 23 may be constituted by a semiconductor integrated circuit (IC) which generates a gate signal of driver element 22 from a control signal, for example.

As described above, signal processing substrate 92 may generate a control signal indicating brightness of each of areas 71 of an image. In this case, each of driver elements 22 and driver elements 23 may drive corresponding LED 21 such that light is emitted with luminance representing brightness indicated by the control signal and corresponding to area 71 associated with corresponding LED 21.

In addition, signal processing substrate 92 may generate a control signal indicating luminance of light emitted from LED 21 associated with each of areas 71 in accordance with brightness of corresponding area 71 of an image. In this case, driver element 22 and driver element 23 may drive corresponding LED 21 such that light is emitted with luminance indicated by the control signal.

In light source substrate 20, openings 24 which receive support pins for supporting flatter 40 to stand the support pins thereon, and screw holes 25 which receive screws fastened to fix light source substrate 20 to base plate 10 are formed.

Each of driver elements 22, driver elements 23, openings 24, and screw holes 25 on light source substrate 20 are disposed on boundaries of adjoining ones of areas 71. Advantageous effects offered from this layout will be described below.

Reflection sheet 30 is hereinafter described.

Figure 4:
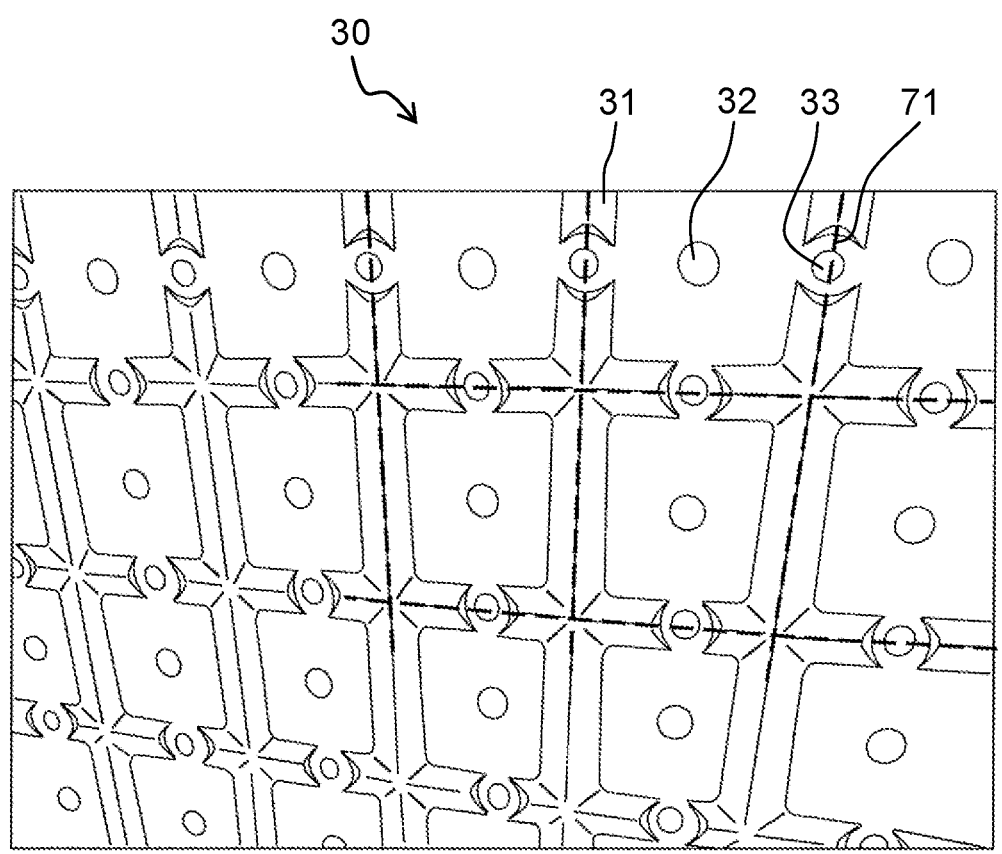
FIG. 4 is a perspective view schematically illustrating an example of a shape of a reflection sheet included in the video display device according to the first exemplary embodiment.

FIG. 4 is a perspective view schematically illustrating an example of a shape of reflection sheet 30 included in video display device 1 according to the first exemplary embodiment. Positions corresponding to areas 71 are indicated by broken lines in a part of FIG. 4 for facilitating visual understanding.

As illustrated in FIG. 4, protrusions 31, openings 32, and openings 33 are formed in reflection sheet 30.

Openings 32 are disposed at positions corresponding to LEDs 21 of light source substrate 20 disposed on the rear side of reflection sheet 30. LEDs 21 are exposed from the rear surface of reflection sheet 30 through openings 32 toward the front surface of reflection sheet 30.

Reflection sheet 30 is made of white synthetic resin to reflect light emitted from LEDs 21. Light is emitted from LEDs 21 penetrating openings 32 and exposed to the front surface, a part of which light (such as light traveling rearward) is reflected on reflection sheet 30 toward the front side (toward liquid crystal display panel 70).

Each of protrusions 31 is hollow and formed at a position separating adjacent ones of openings 32 (i.e., adjacent ones of LEDs 21). More specifically, each of protrusions 31 is formed on the boundary of areas 71 illuminated by corresponding adjacent ones of LEDs 21 (adjoining ones of areas 71) except for a part of the boundary.

Each of openings 33 is formed in reflection sheet 30 at the portion not provided with protrusion 31 on the boundary of corresponding adjoining ones of areas 71. Each of the support pins penetrates opening 33, and opening 24 of light source substrate 20 to be fixed to base plate 10.

Flatter 40 is hereinafter described.

Figure 5:
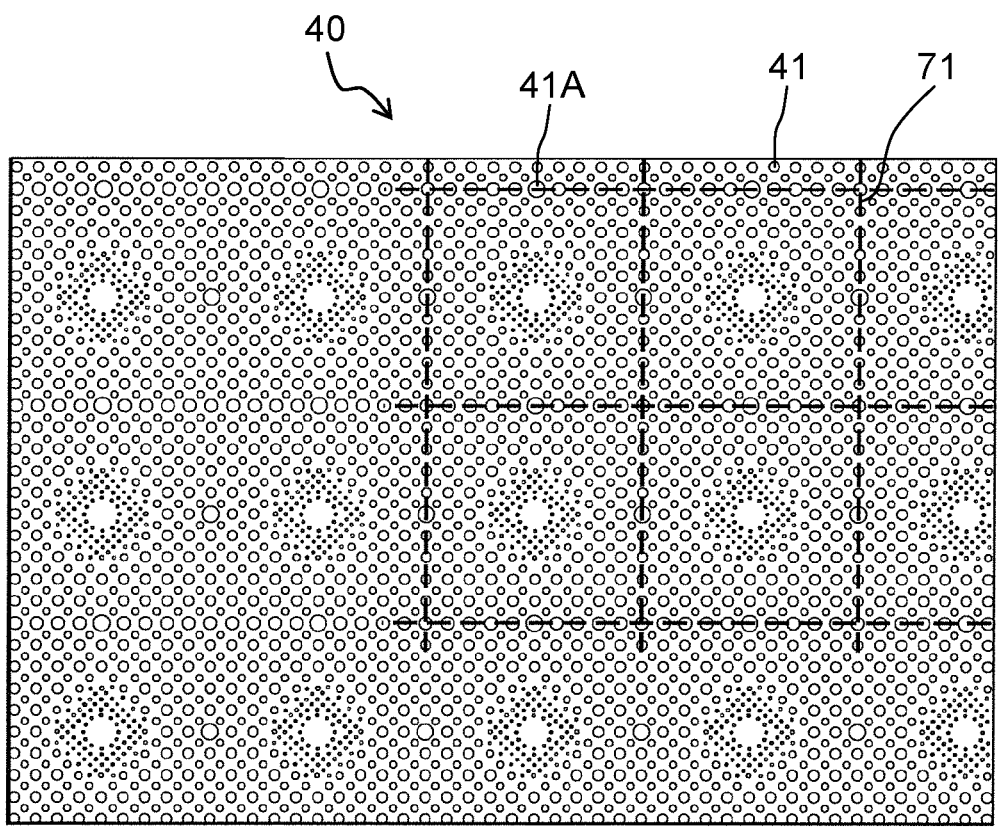
FIG. 5 is a plan view schematically illustrating an example of a shape of a flatter included in the video display device according to the first exemplary embodiment.

FIG. 5 is a plan view schematically illustrating an example of a shape of flatter 40 included in video display device 1 according to the first exemplary embodiment. Positions corresponding to areas 71 are indicated by broken lines in a part of FIG. 5 for facilitating visual understanding.

As illustrated in FIG. 5, holes 41 in various sizes are formed in a sheet of flatter 40 made of synthetic resin. Flatter 40 controls transmittance of light by using holes 41. More specifically, flatter 40 has distribution of transmittance within areas 71 in accordance with a layout (size, position, number) of holes 41. Distribution of transmittance of flatter 40 is so designed as to cancel luminance distribution (luminance variations) which may be produced by LEDs 21 within areas 71 when flatter 40 is absent. This configuration of flatter 40 can improve uniformity of luminance within areas 71.

Attachment of reflection sheet 30 to light source substrate 20, and a layout of respective members are hereinafter described.

Figure 6:
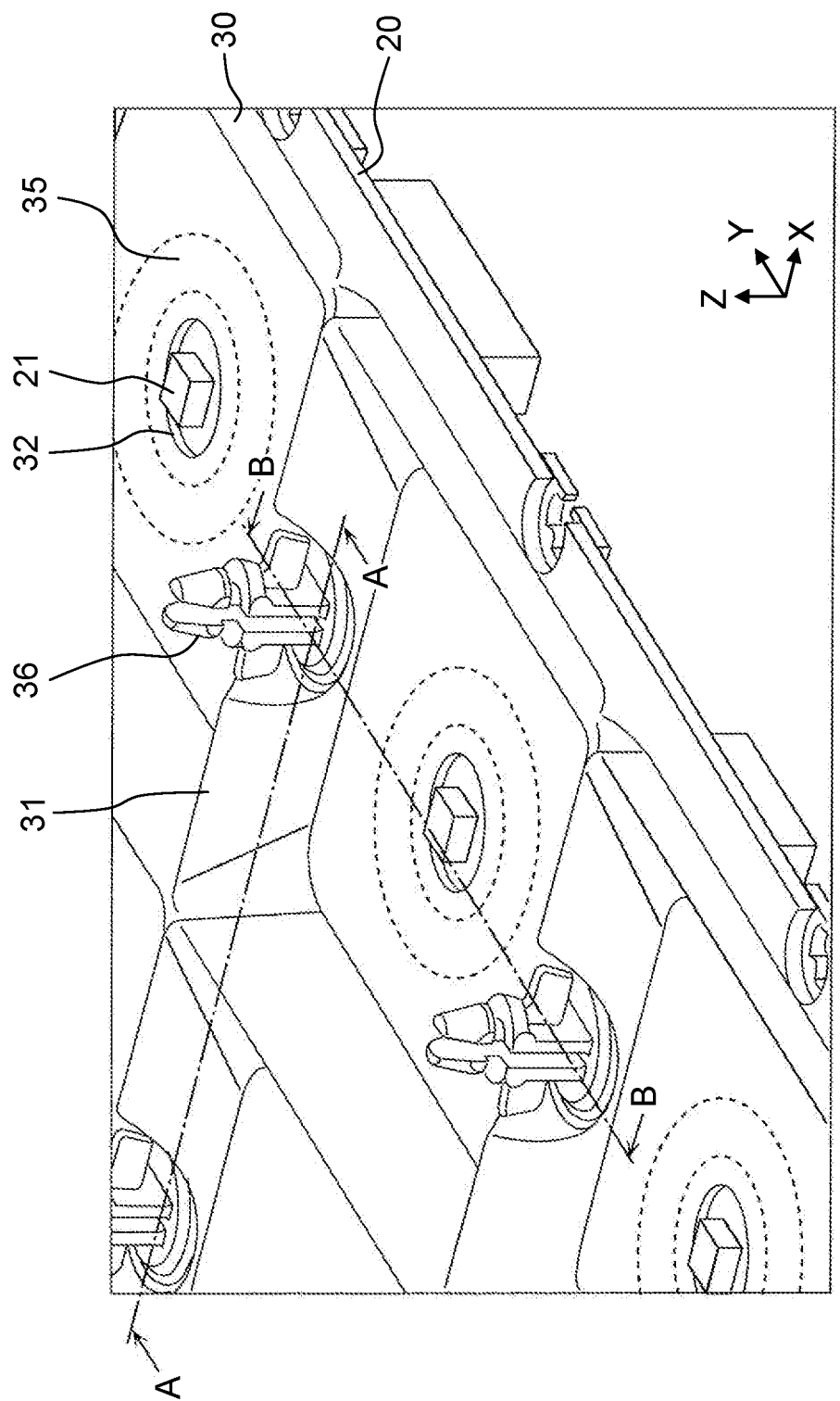
FIG. 6 is a perspective view schematically illustrating an example of attachment of the reflection sheet to the light source substrate in the video display device according to the first exemplary embodiment.

FIG. 6 is a perspective view schematically illustrating an example of attachment of reflection sheet 30 to light source substrate 20 in video display device 1 according to the first exemplary embodiment.

Figure 7:
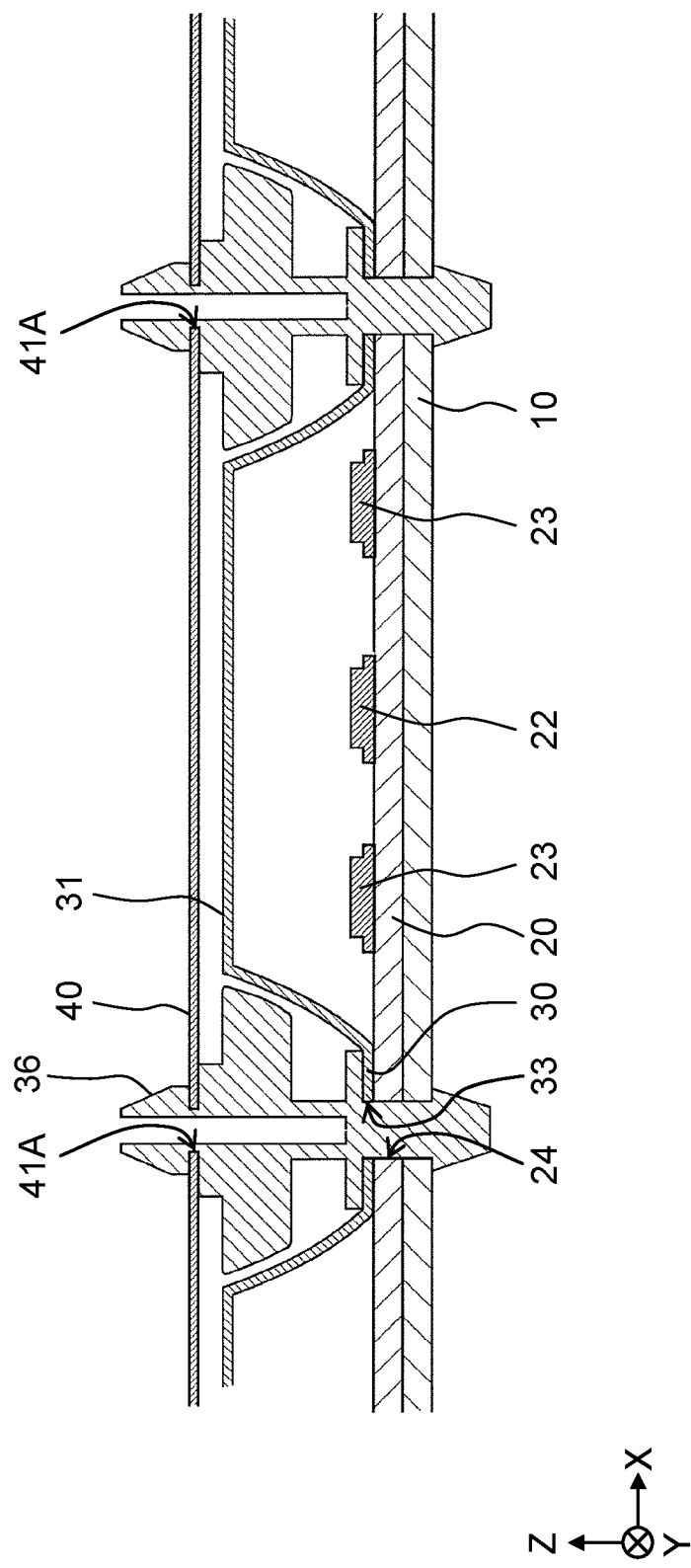
FIG. 7 is a cross-sectional view schematically illustrating an example of a layout of members including the light source substrate, the reflection sheet, and the flatter in the video display device according to the first exemplary embodiment.
Figure 8:
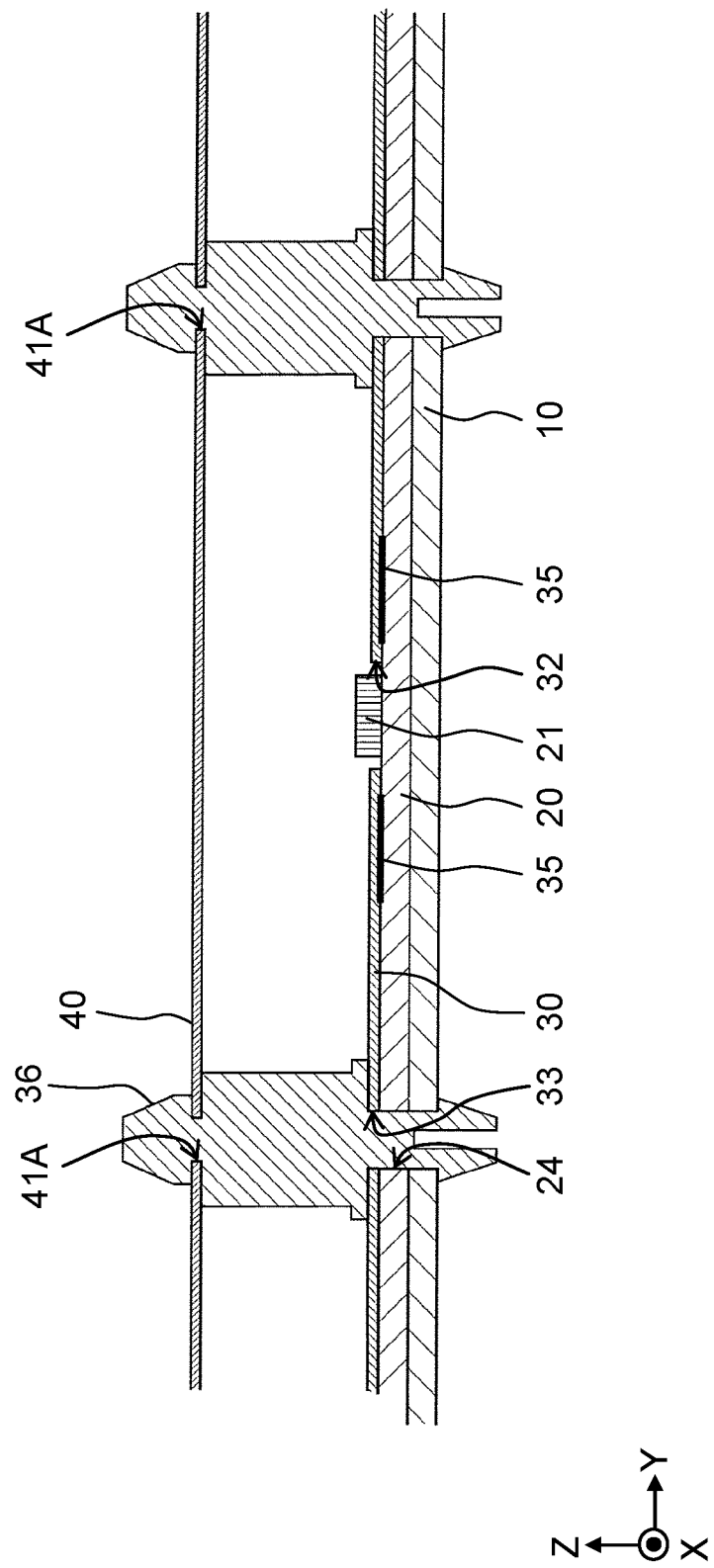
FIG. 8 is a cross-sectional view schematically illustrating an example of a layout of members including the light source substrate, the reflection sheet, and the flatter in the video display device according to the first exemplary embodiment.

FIGS. 7 and 8 are cross-sectional views schematically illustrating an example of a layout of members including light source substrate 20, reflection sheet 30, and flatter 40 in video display device 1 according to the first exemplary embodiment. FIG. 7 illustrates a cross-sectional view taken along a line A-A in FIG. 6, while FIG. 8 illustrates a cross-sectional view taken along a line B-B in FIG. 6. FIG. 6 does not show flatter 40, while FIGS. 7 and 8 show flatter 40.

As illustrated in FIGS. 6, 7, and 8, reflection sheet 30 is affixed to light source substrate 20 via adhesive tapes 35 at flat portions of reflection sheet 30 around openings 32, and also fixed to light source substrate 20 via support pins 36 penetrating openings 24 and openings 33 and attached to base plate 10. Reflection sheet 30 is joined to light source substrate 20 in this manner.

LEDs 21 of light source substrate 20 penetrate from the rear surface of reflection sheet 30 through openings 32 to be exposed to the front surface of reflection sheet 30. Driver elements 22 and driver elements 23 of light source substrate 20 are stored in spaces formed inside protrusions 31 (spaces formed by the presence of protrusions 31 between the rear surface of reflection sheet 30 and the front surface of light source substrate 20).

While not shown in FIGS. 6 through 8, light source substrate 20 is fixed to base plate 10 via screws passing through screw holes 25 (see FIG. 3) and attached to base plate 10. In this case, heads of the screws are also stored within the spaces of protrusions 31. The screws may be made of metal, and may function as electric conductors.

Flatter 40 is disposed on the front side of reflection sheet 30 while supported by support pins 36. More specifically, flatter 40 is supported by support pins 36 in a state that specific holes 41A of flatter 40 are embedded into notches formed in upper portions of support pins 36. Note that, in FIGS. 7 and 8, a plurality of holes 41 (see FIG. 5) formed in flatter 40 are omitted.

Light source substrate 20, reflection sheet 30, and flatter 40 are joined to each other into one structure body in the foregoing manner. Provided thereafter are various types of optical sheets 50 on the front side of the structure body, and liquid crystal display panel 70 on the front side of optical sheets 50 to constitute video display device 1 as illustrated in FIG. 2. According to video display device 1, liquid crystal display panel 70 is illuminated from the rear side with more uniform light emitted from LEDs 21 of light source substrate 20 and passing through flatter 40 and the plurality of optical sheets 50. In this case, brightness of the light illuminating liquid crystal display panel 70 from the rear side is controlled (dimmed) for each area 71 in accordance with images. Accordingly, images having more accurate contrast are displayed on liquid crystal display panel 70.

[1-2. Effects and Others]

Video display device 1 having this configuration offers following advantageous effects.

Initially, video display device 1 is suited for an aim of reducing size, thickness, and assembly cost.

Assumed herein for comparison with video display device 1 is a video display device which includes a backlight containing several hundreds or more of LEDs, and capable of independently controlling the plurality of LEDs similarly to video display device 1. According to this video display device, a substrate on which the plurality of LEDs are provided, and a substrate on which driver elements are provided are separated from each other. The respective substrates are connected to each other via cables to independently control each luminance of the plurality of LEDs. However, the video display device having this configuration requires numerous substrates and cables, and therefore is difficult to reduce the size and thickness of the video display device. In addition, assembly cost of the video display device may increase.

According to video display device 1 presented in this exemplary embodiment, the plurality of LEDs 21, and the plurality of driver elements 22 and driver elements 23 are provided on one light source substrate 20. In this case, reduction of substrates and cables can be realized, and therefore reduction in size, thickness, and assembly cost of video display device 1 can be achieved.

According to video display device 1, a high-voltage LED constituted by including a plurality of LED elements connected in series may be used as each of LEDs 21. When the high-voltage LED is used, driving voltage of LEDs 21 of light source substrate 20 can increase in comparison with use of an LED other than the high-voltage LED (low-voltage LED). In this case, light source substrate 20 can obtain higher light emission luminance while suppressing a rise of driving current. Accordingly, heat generated from the driver elements can be suppressed.

In some cases, LEDs and driver elements are difficult to be provided on one substrate for a reason of difficulty in design for heat radiation or other reasons. However, video display device 1 which includes the high-voltage LED constituting LEDs 21 allows the plurality of LEDs 21 and the plurality of driver elements 22 and 23 to be provided on one light source substrate 20.

In addition, according to video display device 1, protrusions 31 are formed on reflection sheet 30 to separate adjacent ones of LEDs 21. Driver elements 22 and driver elements 23 are stored within protrusions 31.

When unnecessary wrinkles, bulges or the like are produced on reflection sheet 30 by the presence of the driver elements or the like, luminance non-uniformity may be caused within areas 71. According to video display device 1, however, driver elements 22 and driver elements 23 are stored within the spaces formed by protrusions 31 on the rear side of reflection sheet 30. In this case, luminance non-uniformity caused by interference between the driver elements and reflection sheet 30 can be prevented. Accordingly, driver elements 22 and driver elements 23 of video display device 1 can be provided on light source substrate 20 by effectively utilizing spaces inside protrusions 31.

In addition, according to video display device 1 which includes protrusions 31 to separate adjoining ones of areas 71, mutual light leakage between areas 71 illuminated by adjacent ones of LEDs 21 decreases. This decrease in leakage of light can improve accuracy of brightness of respective areas 71 produced by LEDs 21. Accordingly, illumination of liquid crystal display panel 70 with more accurate luminance can be realized.

In addition, in imagevideo display device 1, protrusions 31 are formed on the boundaries of areas 71 illuminated by adjacent ones of LEDs 21 except for a part of the boundaries. Support pins 36 for supporting flatter 40 are attached to base plate 10 while penetrating portions not provided with protrusions 31 in reflection sheet 30. In this case, shadows of support pins 36 are less likely to appear within areas 71, wherefore it can be suppressed that the presence of support pins 36 becomes the cause of lowering of luminance within areas 71.

In addition, central portions of the boundaries of adjoining ones of areas 71 are relatively close to LEDs 21, and therefore exhibit relatively high brightness. According to video display device 1, support pins 36 are disposed in the central portions (substantially central portions). In this case, lowering of luminance caused by the presence of support pins 36 becomes less noticeable than in a case when support pins 36 are disposed at ends of the boundaries in regions relatively far from LEDs 21 and thus exhibiting relatively low brightness.

According to the video display device including the plurality of LEDs capable of independently dimming in this exemplary embodiment described above, reduction in size, thickness, and assembly cost of the video display device can be achieved.

Second Exemplary Embodiment

A second exemplary embodiment is hereinafter described with reference to FIGS. 9 and 10.

Video display device 1 (not shown) presented according to the second exemplary embodiment is substantially similar to video display device 1 presented in the first exemplary embodiment, except for that a configuration not disclosed in the first exemplary embodiment is added. The configuration not disclosed in the first exemplary embodiment is chiefly discussed hereinbelow, with appropriate omission of the matters already described in the first exemplary embodiment.

[2-1. Configuration]

Disclosed in the second exemplary embodiment is video display device 1 which includes light source substrate 20 configured to make electric connection with other substrates via cables. According to the second exemplary embodiment, light source substrate 20 has a configuration for connection with cables via connectors appropriately selected, in addition to the configuration of video display device 1 of the first exemplary embodiment.

In the following description, constituent elements substantially similar to the constituent elements included in video display device 1 according to the first exemplary embodiment have been given reference numbers similar to the reference numbers of the constituent elements of the first exemplary embodiment. The description of these constituent elements is omitted.

A plurality of connectors for connection with cables are provided on the rear surface of light source substrate 20. These connectors are used to distribute signals and power between a plurality of light source substrates 20 via cables. This distribution will be described below.

Figure 9:
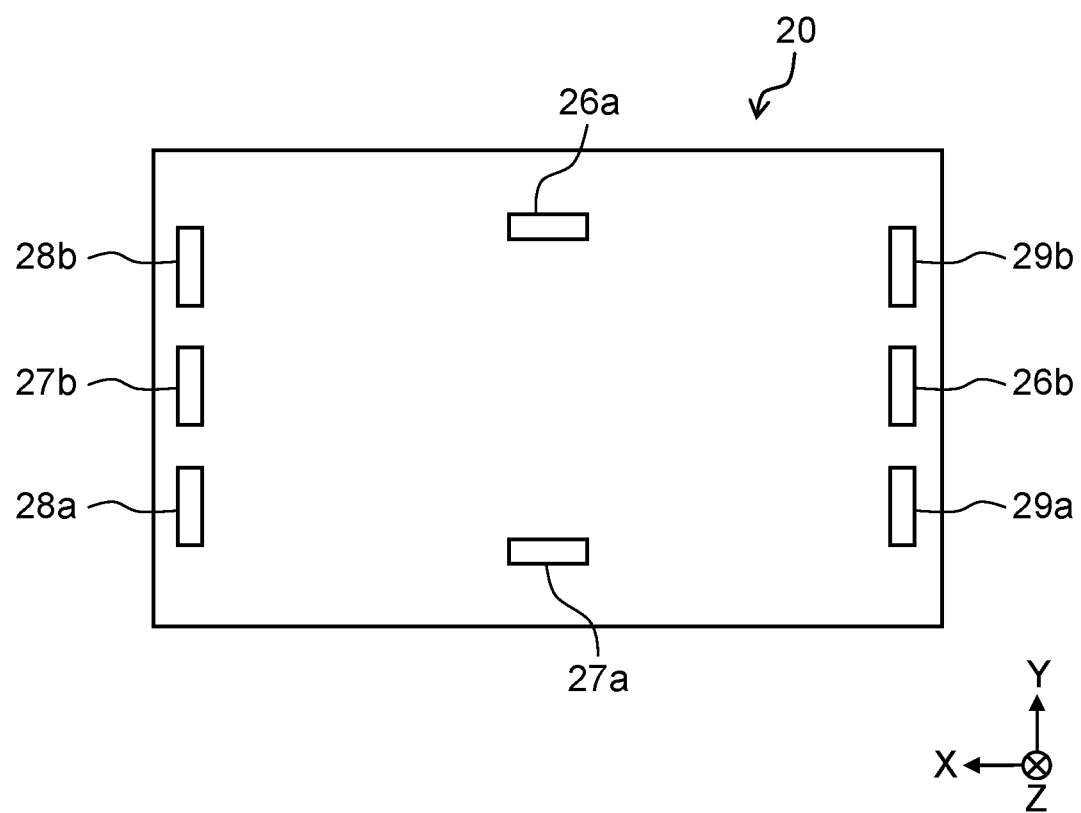
FIG. 9 is a plan view schematically illustrating an example of a layout of connectors provided on a light source substrate in a video display device according to a second exemplary embodiment.

FIG. 9 is a plan view schematically illustrating an example of a layout of connectors provided on light source substrate 20 in video display device 1 according to the second exemplary embodiment. Note that FIG. 9 illustrates a plan view of light source substrate 20 on the rear side.

As illustrated in FIG. 9, light source substrate 20 includes signal input connector 26a, signal input connector 26b, signal output connector 27a, signal output connector 27b, power input connector 28a, power input connector 28b, power output connector 29a, and power output connector 29b. These connectors are disposed at different positions in the rear surface of light source substrate 20.

Each of the connectors adopted herein is a terminal (so-called land pattern) on light source substrate 20 for allowing electric connection with a cable. Cables may be connected to the corresponding connectors directly. Alternatively, cables may be connected to the corresponding connectors via sockets or receptacles attached to the connectors for receiving the cables. In addition, according to light source substrates 20, the connectors for connection of cables can be selected appropriately for positions of respective light source substrates 20. In this case, a connector disposed at a certain position in one light source substrate 20 may receive a cable, but a connector disposed at the same position but in different light source substrate 20 provided at a different location may not receive a cable.

Light source substrate 20 includes wiring (not shown) configured such that a control signal input from signal processing substrate 92 or different light source substrate 20 to signal input connector 26a is distributed to driver elements provided on corresponding light source substrate 20, and also output from both signal output connector 27a and signal output connector 27b (hereinafter also referred to as "through-output"). In addition, light source substrate 20 includes wiring (not shown) through which a control signal input from signal input connector 26b is distributed to driver elements provided on light source substrate 20, and is also through-output from signal output connector 27b.

Accordingly, when a control signal is input to signal input connector 26a of light source substrate 20 from signal processing substrate 92 or different light source substrate 20, this control signal is through-output from both signal output connector 27a and signal output connector 27b. In addition, when a control signal is input to signal input connector 26b of light source substrate 20, this control signal is through-output from signal output connector 27b. Note that these control signals are signals indicating luminance of light emission from each of LEDs 21 to allow light emission of each of LEDs 21 with luminance corresponding to brightness of associated area 71 in an image. According to light source substrate 20, each of the plurality of LEDs 21 of light source substrate 20 is driven (dimmed) by driver elements 22 and 23 to emit light with luminance corresponding to the control signals.

In addition, light source substrate 20 includes wiring (not shown) configured such that power input from power supply substrate 93 or different light source substrate 20 to power input connector 28a or power input connector 28b is distributed to respective elements provided on corresponding light source substrate 20, and also through-output from power output connector 29a and power output connector 29b.

Accordingly, when power is input from power supply substrate 93 or different light source substrate 20 to either one of power input connector 28a and power input connector 28b, this power is through-output from both power output connector 29a and power output connector 29b of light source substrate 20. Each of the plurality of LEDs 21 of light source substrates 20 is driven by the power thus output.

As described above, light source substrate 20 according to the second exemplary embodiment includes a plurality of connectors at different positions to distribute signals or power. Accordingly, in case of light source substrate 20 included in video display device 1 of the second exemplary embodiment, for example, connectors can be appropriately selected and used according to the positions of other members. For example, when one connector is unavailable to be used for other member, other connectors can be appropriately selected and used. In this case, video display device 1 of this exemplary embodiment is allowed to include a plurality of light source substrates 20 having the same configuration when the plurality of light source substrates 20 are attached to base plate 10, even when available connectors are different according to the attachment position, for example. As a result, cost reduction can be achieved by using the plurality of light source substrates 20 having the same configuration (i.e., by using common substrates) according to video display device 1 of the second exemplary embodiment.

This configuration shown in the second exemplary embodiment is suitable for a backlight constituted by the plurality of light source substrates 20 electrically connected to each other (cascade connection), for example.

Figure 10:
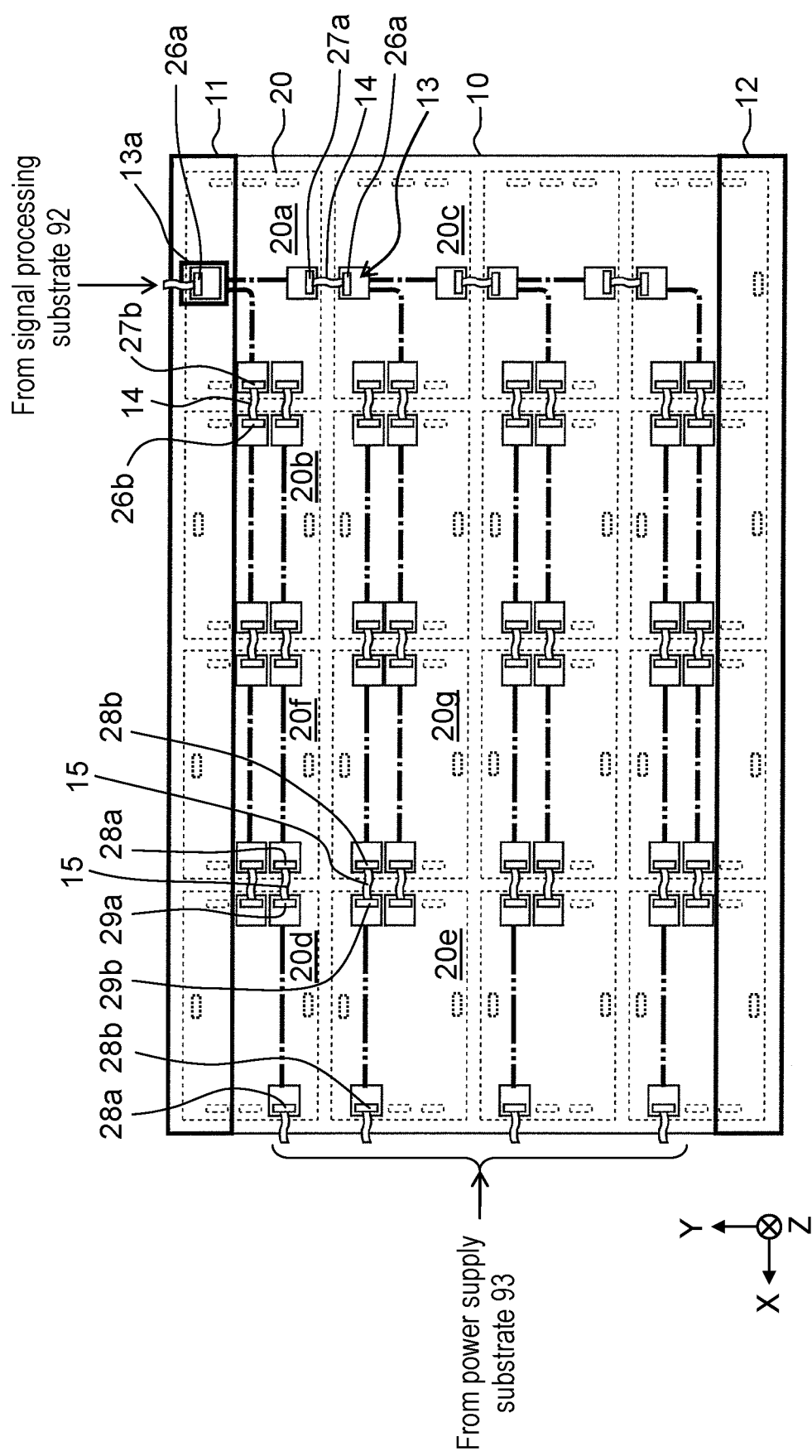
FIG. 10 is a plan view schematically illustrating an example of connection of a plurality of the light source substrates constituting a backlight in the video display device according to the second exemplary embodiment.

FIG. 10 is a plan view schematically illustrating an example of connection of the plurality of light source substrates 20 constituting a backlight in video display device 1 according to the second exemplary embodiment.

The plan view shown in FIG. 10 illustrates the rear side of base plate 10 to which 16 light source substrates 20 are attached by way of example. Light source substrates 20 are attached to the front surface of base plate 10, wherefore attachment positions of light source substrates 20 are indicated by broken lines in FIG. 10. Note that the number of light source substrates 20 attached to base plate 10 is not limited to 16.

As indicated by the broken lines in FIG. 10, the plurality of light source substrates 20 included in video display device 1 are arranged in matrix on base plate 10. In this case, the plurality of light source substrates 20 are electrically connected to each other (cascade connection) via cables 14 or cables 15 as illustrated in FIG. 10.

As illustrated in FIG. 10, reinforcing beam 11 is provided at an upper end of the rear surface of base plate 10, while reinforcing beam 12 is provided at a lower end of the rear surface of base plate 10. A plurality of openings 13 are formed in base plate 10 to allow electric connection between predetermined connectors of light source substrate 20 and other substrates (signal processing substrate 92, power supply substrate 93, or different light source substrate 20) via cables. Reinforcing beam 11 includes opening 13a disposed substantially at the same position as the position of predetermined one of the plurality of openings 13 formed in base plate 10 to allow electric connection between a predetermined connector (such as signal input connector 26a) of one light source substrate 20 (such as light source substrate 20a) and another substrate (such as signal processing substrate 92) via a cable. In this case, respective connectors provided on the rear surfaces of respective light source substrates 20 are exposed to the rear side of base plate 10 through openings 13 formed in base plate 10, or both opening 13 and opening 13a formed in reinforcing beam 11. Accordingly, connectors of respective light source substrates 20 can be electrically connected with each other via cables 14 or cables 15 passing through the rear side of base plate 10.

According to video display device 1 of the second exemplary embodiment, 16 light source substrates 20 are electrically connected with each other via cables 14 and cables 15 to constitute a backlight. Note that seven light source substrates 20 in upper two rows are given reference numbers 20a through 20g in FIG. 10 to simplify the description.

More specifically, as illustrated in FIG. 10, signal output connector 27b of each of light source substrates 20 is electrically connected to signal input connector 26b of neighboring light source substrate 20 on the left side in the figure via cable 14. However, signal output connector 27a of each of four light source substrates 20 at the right end in the figure is electrically connected to signal input connector 26a of light source substrate 20 disposed immediately below in the figure via cable 14. In addition, signal input connector 26a of light source substrate 20a at the right upper end in the figure is electrically connected to signal processing substrate 92 via a cable.

In this case, a control signal supplied from signal processing substrate 92 is input to signal input connector 26a of light source substrate 20a. This control signal is through-output from signal output connector 27a and signal output connector 27b of light source substrate 20a, and input to each of signal input connector 26a of light source substrate 20c and signal input connector 26b of light source substrate 20b via cables 14. Thereafter, the control signal is distributed from one light source substrate 20 to other light source substrates 20 via cables 14 based on the foregoing configuration. Similar distribution is repeated to distribute the control signal supplied from signal processing substrate 92 to all light source substrates 20 included in video display device 1. Note that paths to which control signals are distributed are indicated by alternate long and short dash lines in FIG. 10.

Power supplied from power supply substrate 93 is input to four light source substrates 20 disposed at the left end in FIG. 10. However, power input connector 28b and power output connector 29b of each of four light source substrates 20 (light source substrates 20a, 20b, 20d, 200 disposed in the uppermost row in FIG. 10 are not available by the presence of reinforcing beam 11. Accordingly, power supplied from power supply substrate 93 is input to power input connector 28a of light source substrate 20d in the uppermost row included in the four light source substrates at the left end, instead of power input connector 28b not available by the presence of reinforcing beam 11. On the other hand, corresponding power is input to power input connector 28b of each of other three light source substrates 20 of the four light source substrates at the left end, including light source substrate 20e. This power is through-output from power output connector 29a of light source substrate 20d, instead of power output connector 29b not available by the presence of reinforcing beam 11, and input to power input connector 28a of neighboring light source substrate 20f on the right side in the figure via cable 15. On the other hand, the power is through-output from power output connector 29b of each of other three light source substrates 20 including light source substrate 20e, and input via cable 15 to power input connector 28b of each of neighboring light source substrate 20 on the right side in the figure. The power is distributed from one light source substrate 20 to other light source substrates 20 in this manner. Similar distribution is repeated to distribute the power supplied from power supply substrate 93 to all light source substrates 20 included in video display device 1. Note that paths to which power is distributed are indicated by alternate long and two short dashes lines in FIG. 10.

Light source substrates 20 included in video display device 1 are operated by control signals and power distributed in the manner described above. Each of the plurality of LEDs 21 is driven (dimmed) such that light is emitted with luminance indicated by the distributed control signal.

[2-2. Effects and Others]

According to video display device 1 having this configuration, reduction of cables necessary for connection can be realized by electric connection of the plurality of light source substrates 20 (cascade connection).

In addition, a plurality of connectors for distributing signals or power are disposed at positions different from each other in light source substrate 20. Herewith, connectors can be appropriately selected and used according to the positions of other members. For example, when one connector is unavailable to be used for other member (such as reinforcing beam 11), other connectors can be appropriately selected and used.

According to the video display device including the plurality of LEDs capable of independently dimming in this exemplary embodiment described above, reduction in size, thickness, and assembly cost of the video display device can be achieved.

Third Exemplary Embodiment

A third exemplary embodiment is hereinafter described with reference to FIGS. 11 and 16.

Video display device 1 (not shown) presented according to the third exemplary embodiment is substantially similar to video display device 1 presented in the first exemplary embodiment or the second exemplary embodiment. However, according to video display device 1 of the third exemplary embodiment, a configuration appropriate for control of heat is provided on each of light source substrates 20. This structure is characterized by positioning of conductive foil provided on light source substrate 20. Note that the conductive foil herein refers to a conductor constituted by a metal thin film or the like and formed on the substrate to supply power, a ground, or a signal to respective elements provided on light source substrate 20. The configuration not disclosed in the first exemplary embodiment and the second exemplary embodiment is chiefly discussed hereinbelow, with appropriate omission of the matters already described in the first exemplary embodiment and the second exemplary embodiment.

[3-1. Configuration]

Figure 11:
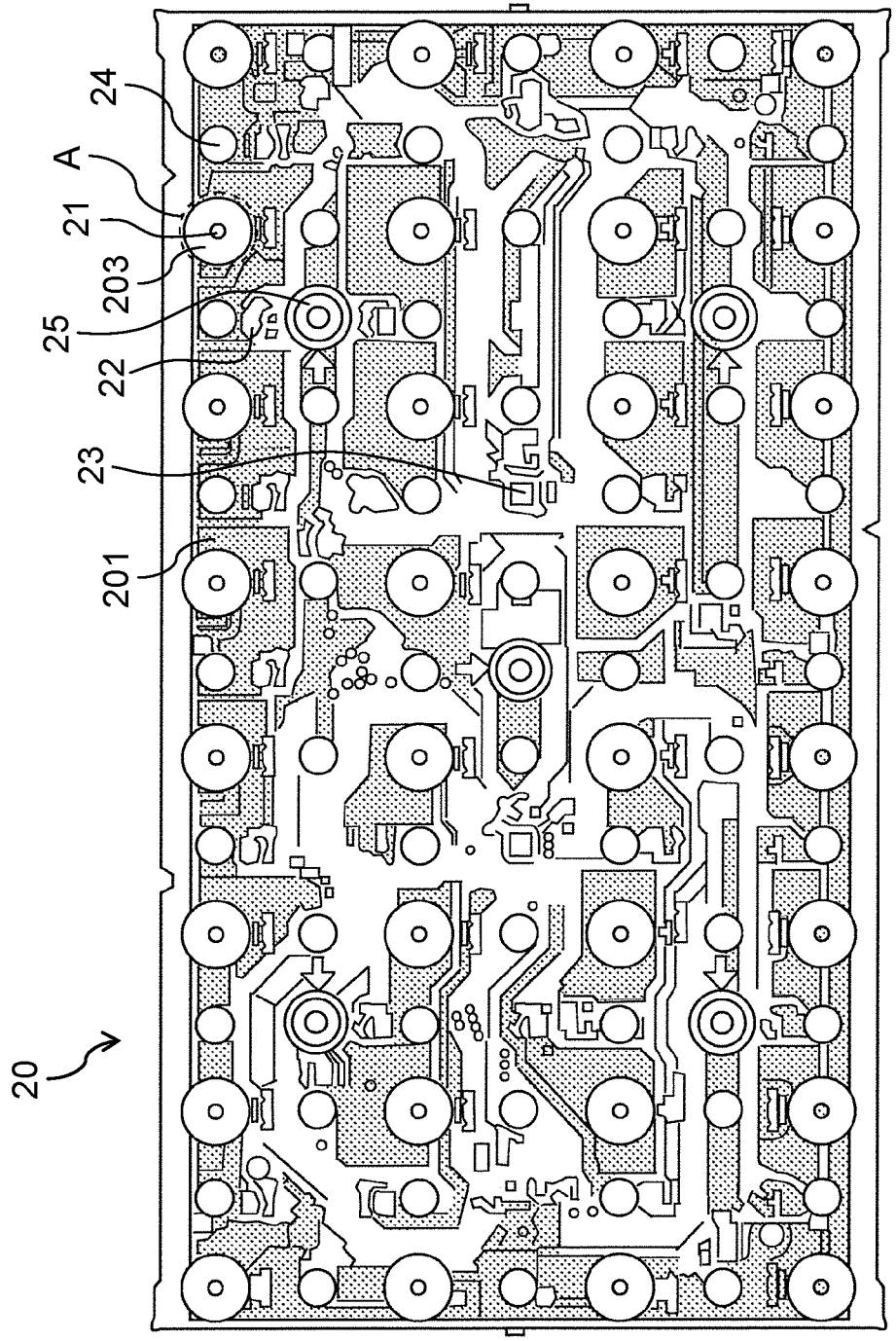
FIG. 11 is a plan view schematically illustrating an example of first conductive foil disposed on a first main surface of a light source substrate included in a video display device according to a third exemplary embodiment.

FIG. 11 is a plan view schematically illustrating an example of first conductive foil disposed on a first main surface of light source substrate 20 included in video display device 1 according to the third exemplary embodiment.

In the following description, constituent elements substantially similar to the constituent elements included in video display device 1 according to the first exemplary embodiment or the second exemplary embodiment have been given reference numbers similar to the reference numbers of the constituent elements of the first exemplary embodiment or the second exemplary embodiment. The description of these constituent elements is omitted.

The first main surface is a surface on which LEDs 21, driver elements 22, and driver elements 23 are provided. Power supply pattern foil 201 and signal pattern foil 203 are disposed on the first main surface. Each of power supply pattern foil 201 and signal pattern foil 203 is presented as an example of conductive foil. According to the example illustrated in FIG. 11, power supply pattern foil 201 is disposed in a gray area, while signal pattern foil 203 is disposed in a part of a white area. Ground pattern foil may be further disposed on the first main surface. The respective types of conductive foil disposed on the first main surface (such as power supply pattern foil 201 and signal pattern foil 203) are hereinafter collectively referred to as first conductive foil. More specifically, power input connector 28a, power input connector 28b, power output connector 29a, and power output connector 29b are presented as an example of a plurality of power source connectors electrically connected to the first conductive foil (power supply pattern foil 201) at positions different from each other. Note that a surface of light source substrate 20 disposed on the side opposite to the first main surface is referred to as a second main surface. The ground corresponds to a ground potential or a reference potential.

Figure 12:
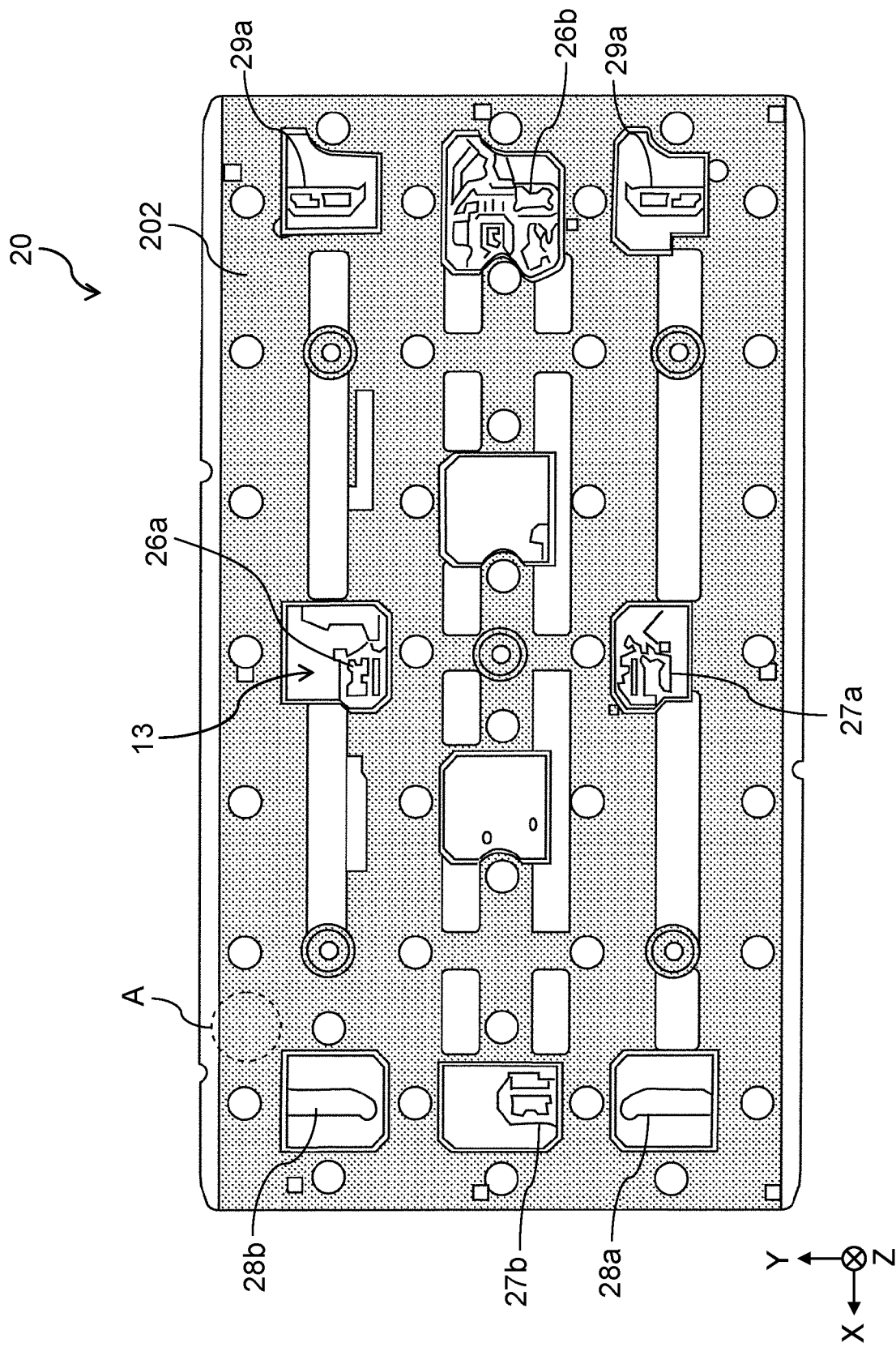
FIG. 12 is a plan view schematically illustrating an example of second conductive foil disposed on a second main surface of the light source substrate included in the video display device according to the third exemplary embodiment.

FIG. 12 is a plan view schematically illustrating an example of second conductive foil disposed on a second main surface of light source substrate 20 included in video display device 1 according to the third exemplary embodiment.

Ground pattern foil 202 is disposed on the second main surface. Ground pattern foil 202 is an example of conductive foil. According to the example illustrated in FIG. 12, ground pattern foil 202 is disposed in a gray area. Signal pattern foil may be further provided on the second main surface. The respective types of conductive foil disposed on the second main surface (such as ground pattern foil 202) are hereinafter collectively referred to as second conductive foil.

When the first conductive foil and the second conductive foil have different areas, the substrate easily bends at the time of mounting. Accordingly, the first conductive foil and the second conductive foil are configured to have substantially an equivalent area according to this exemplary embodiment. In other words, the first conductive foil and the second conductive foil of light source substrate 20 according to this exemplary embodiment have substantially an equivalent area. The expression "substantially equivalent" herein refers to a state that an area difference between the first conductive foil and the second conductive foil is determined within a range producing substantially no bend of the substrate at the time of mounting. This range is variable with material, size, thickness or the like of the substrate, and therefore is preferably determined in consideration of these conditions.

FIG. 13 is a cross-sectional view schematically illustrating an example of a structure of light source substrate 20 included in video display device 1 according to the third exemplary embodiment. FIG. 13 illustrates an example of a cross-sectional structure of region A (region indicated by a circle encircled by broken line in FIG. 11). Note that region A is a region including LED 21 in a plan view of light source substrate 20 (when the first main surface of light source substrate 20 is viewed in a direction perpendicular to the first main surface, for example). In FIG. 13, an upper surface of substrate 200 corresponds to the first main surface of light source substrate 20, while a lower surface of substrate 200 corresponds to the second main surface of light source substrate 20.

As illustrated in FIG. 13, signal pattern foil 203 is disposed on region A (i.e., region including a portion immediately below LED 21 in FIG. 13) of the first main surface of light source substrate 20 (upper surface of substrate 200), while ground pattern foil 202 is disposed on region A of the second main surface of light source substrate 20 (lower surface of substrate 200). In this case, ground pattern foil 202 is disposed at least on a region corresponding to LED 21 in the second main surface. Ground pattern foil (not shown) may be further disposed on region A of the first main surface of light source substrate 20. In this case, LED 21 may be driven by current supplied via signal pattern foil 203 and the ground pattern foil thus provided. This structure is applicable to regions each of which includes corresponding one of LEDs 21 in light source substrate 20.

Concerning an example of materials constituting light source substrate 20, substrate 200 may be made of resin such as glass epoxy, while power supply pattern foil 201, ground pattern foil 202, and signal pattern foil 203 may be made of metal including copper, for example. LEDs 21 may be soldered to signal pattern foil 203 and ground pattern foil (not shown) on the first main surface of light source substrate 20. However, this exemplary embodiment is not limited to this configuration.

Generally, metal material achieves higher heat radiation efficiency than resin material. Accordingly, heat from LEDs 21 can be more efficiently dissipated to the outside when ground pattern foil 202 is disposed on the second main surface of light source substrate 20 immediately below LEDs 21 (immediately below LEDs 21 in FIG. 13, i.e., regions corresponding to LEDs 21 in the second main surface), in comparison with a configuration having a different layout.

Wider ground pattern foil 202 provided on the second main surface dissipates more heat. Accordingly, it is preferable that widest possible ground patter foil 202 be provided on the second main surface of light source substrate 20. In this case, wider power supply pattern foil 201 is provided on the first main surface such that the conductive foil on each of the surfaces of light source substrate 20 (i.e., first conductive foil on the first main surface and second conductive foil on the second main surface) has a substantially equivalent area. In this case, a bend of the substrate can be suppressed while maintaining preferable heat dissipation from light source substrate 20.

When wide power supply pattern foil 201 is provided on the first main surface of light source substrate 20, effects of improvement of power supply efficiency and suppression of heat generation can be obtained as well as suppression of a bend of the substrate. The effect of suppression of heat generation is hereinafter described.

As illustrated in FIG. 10, a plurality of (four in the example of FIG. 10) light source substrates 20 are connected in series via cables 15 in video display device 1. In this case, operation power for light source substrates 20 is distributed from power supply substrate 93 to respective light source substrates 20 via this connection. According to this configuration, a power supply line is chiefly constituted by power supply pattern foil 201 provided on the first main surface of each of light source substrates 20, while a ground line is chiefly constituted by ground pattern foil 202 provided on the second main surface of each of light source substrates 20.

Figure 14:
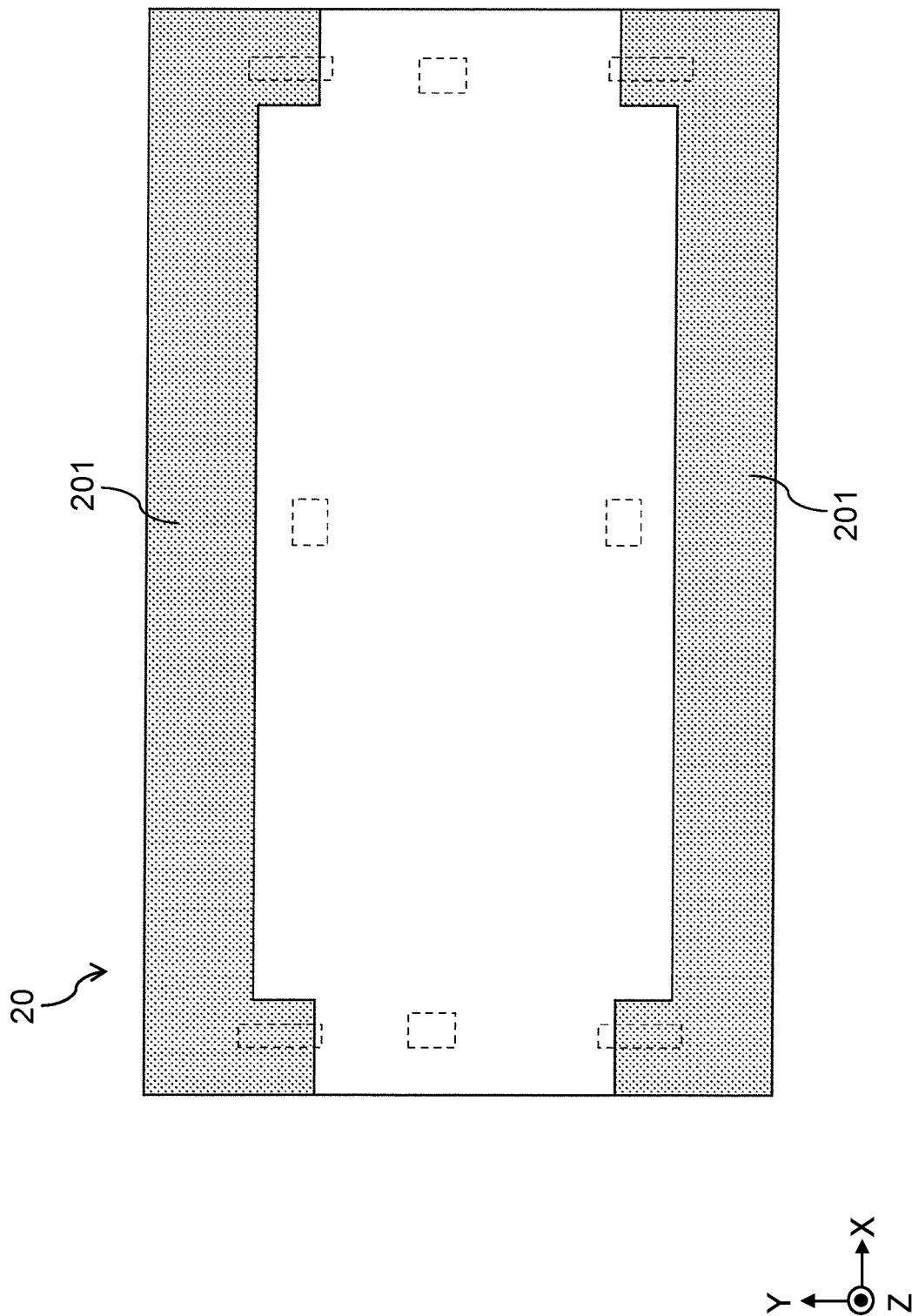
FIG. 14 is a conceptual diagram illustrating an example of a power supply line constituted by power supply pattern foil on the light source substrate included in the video display device according to the third exemplary embodiment.

FIG. 14 is a conceptual diagram illustrating an example of the power supply line constituted by power supply pattern foil 201 on light source substrate 20 included in video display device 1 according to the third exemplary embodiment. FIG. 14 illustrates an equivalent diagram of an example of the power supply line constituted by relatively wide power supply pattern foil 201 of light source substrate 20 which includes relatively wide ground pattern foil 202 for heat dissipation. A gray area indicates an equivalent power supply line in FIG. 14.

Figure 15:
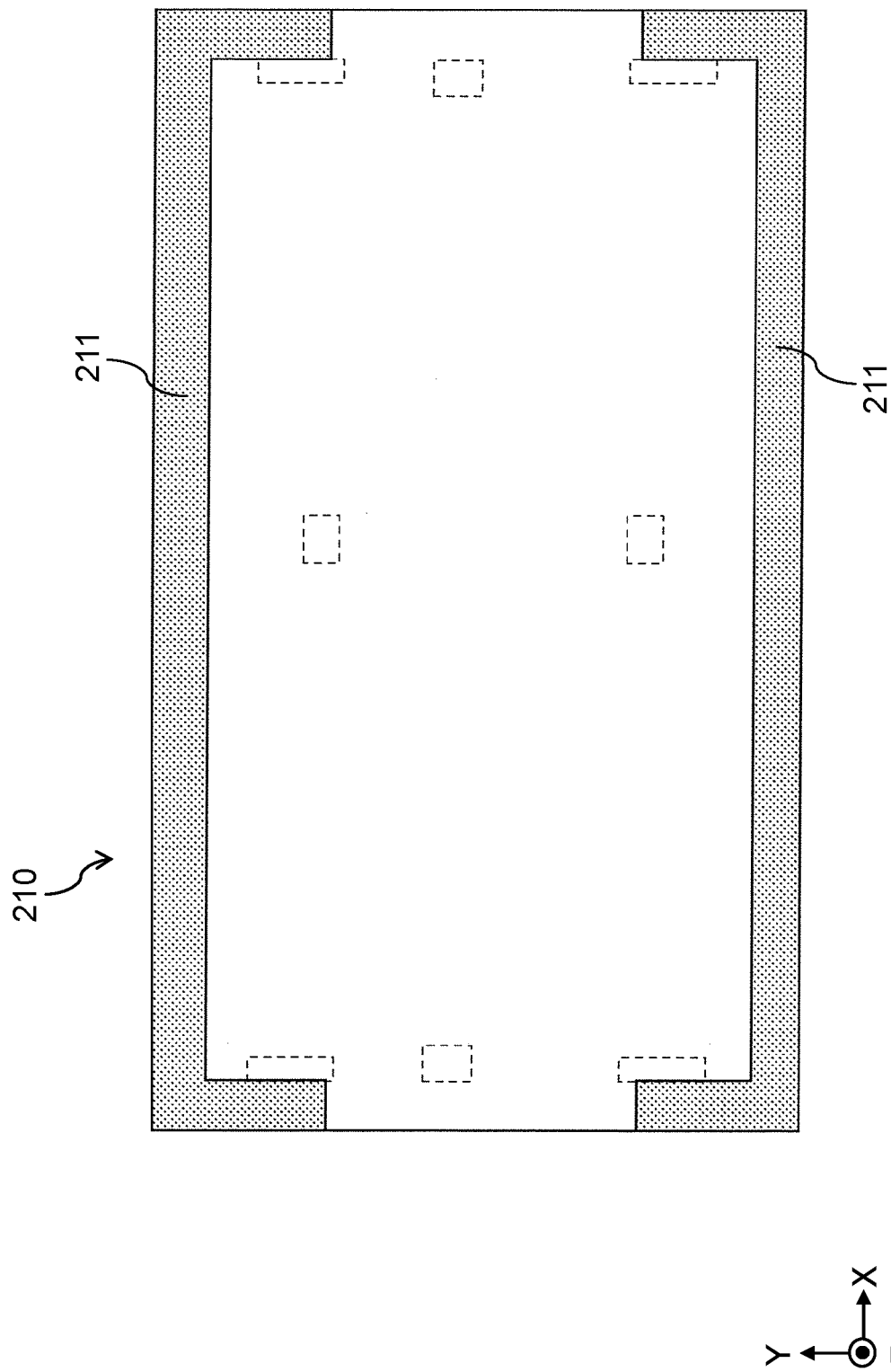
FIG. 15 is a conceptual diagram illustrating an example of a power supply line constituted by power supply pattern foil on a light source substrate in a comparative example.

FIG. 15 illustrates a comparative example for FIG. 14. FIG. 15 is a conceptual diagram illustrating an example of a power supply line constituted by power supply pattern foil 211 of light source substrate 210 according to the comparative example. FIG. 15 illustrates an equivalent diagram of an example of the power supply line constituted relatively narrow power supply pattern foil 211 of light source substrate 210 which does not include wide ground pattern foil (i.e., includes relatively narrow ground pattern foil) for heat dissipation. A gray area indicates an equivalent power supply line in FIG. 15.

As described above, wide ground pattern foil 202 is provided on light source substrate 20 for heat dissipation. In this case, power supply pattern foil 201 having an area substantially equivalent to the area of ground pattern foil 202 is formed to reduce a bend of the substrate. Accordingly, a width of power supply pattern foil 201 of light source substrate 20 illustrated in FIG. 14 is larger than the corresponding width of the comparative example illustrated in FIG. 15, wherefore a power supply line to be produced has a larger width.

In addition, light source substrate 20 is fixed to base plate 10 via screws penetrating screw holes 25 as described with reference to FIGS. 2 and 3. The respective screws are made of metal, and function as electric conductors. The screws are presented as an example of a metal fastening member. As described above, base plate 10 is also made of metal. Accordingly, ground pattern foil 202 is electrically connected to base plate 10 via the screws when screw holes 25 are formed such that ground pattern foil 202 is electrically connected to the screws. According to this configuration, base plate 10 functioning as a rigid base for holding light source substrate 20 also functions as a part of the ground line.

When base plate 10 having relatively low electrical resistance (hereinafter abbreviated as resistance) functions as a part of the ground line, an area of ground pattern foil necessary for power distribution in light source substrate 20 can decrease. When the area of the ground pattern foil decreases, an area of power supply pattern foil is allowed to increase accordingly. In this configuration, the width of the power supply line (power supply pattern foil 201) illustrated in FIG. 14 is allowed to further increase.

Each of the power supply line constituted by power supply pattern foil 201 having a large area, and the ground line using base plate 10 has relatively low resistance. In this case, a voltage drop produced at the time of power distribution decreases in light source substrate 20 of this exemplary embodiment, wherefore suppression of heat generation from driver elements 22 and driver elements 23 can be achieved. This point is further detailed with reference to FIG. 16.

Figure 16:
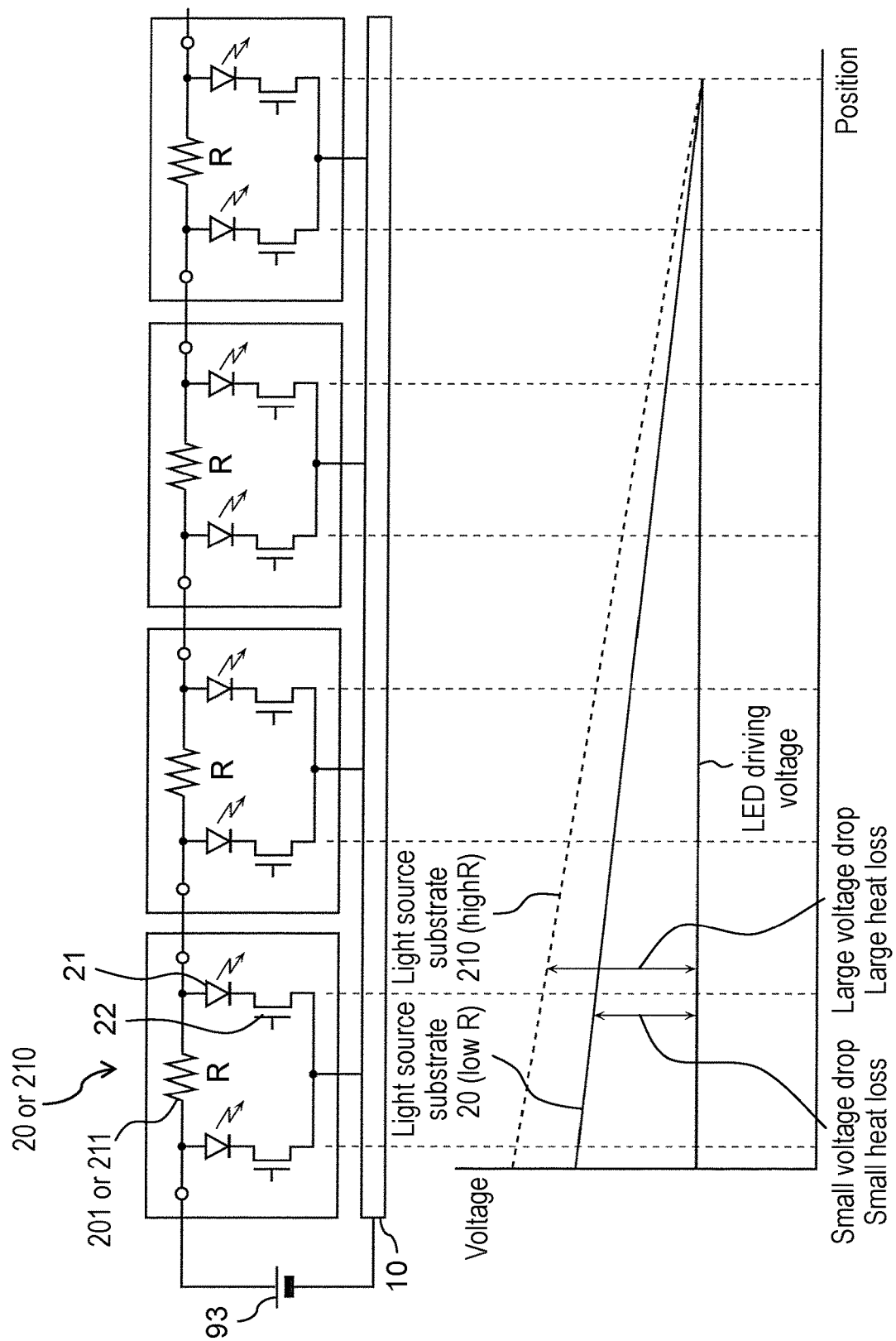
FIG. 16 is a diagram describing a heat generation suppressing effect produced by the light source substrate included in the video display device according to the third exemplary embodiment.

FIG. 16 is a diagram describing a heat generation suppressing effect produced by light source substrates 20 included in video display device 1 according to the third exemplary embodiment.

A diagram shown in an upper part of FIG. 16 is a circuit diagram illustrating an example of equivalent circuits for distributing power in respective light source substrates 20. In this circuit diagram, resistance R indicates a power supply line of light source substrate 20, while a white bar indicates base plate 10 corresponding to a ground line.

A diagram shown in a lower part of FIG. 16 is a graph schematically showing an example of a power supply voltage in consideration of a voltage drop produced by the power supply line (resistance R). In this graph, a state of a voltage drop of light source substrate 210 (see FIG. 15) having relatively high resistance R (i.e., power supply line has a relatively small width) is indicated by a broken line, while a state of a voltage drop of light source substrate 20 (see FIG. 14) having relatively low resistance R (i.e., power supply line has a relatively large width) is indicated by a solid line. For maintaining the power supply voltage of light source substrate 20 (or 210) disposed in a final stage (light source substrate at the right end in the figure) at a predetermined voltage, an initial value of the power supply voltage (voltage at the left end in the graph, such as power supply voltage generated by power supply substrate 93) needs to be raised to a relatively high voltage to compensate for a voltage drop of the power supply line of light source substrate 210 having relatively high resistance R, in comparison with light source substrate 20 having relatively low resistance R.

Accordingly, light source substrate 20 only requires a relatively low initial power supply voltage unlike light source substrate 210. In this case, heat loss of driver elements 22 and driver elements 23 becomes relatively small, wherefore heat generation decreases as apparent from FIG. 16. Particularly, driver elements 22 are transistors which control operation current of LEDs 21 by converting a difference between the power supply voltage and the voltage for driving LEDs 21 into heat by utilizing on-resistance of driver elements 22. Accordingly, heat generation considerably can be suppressed with reduction of the initial power supply voltage.

For further increasing the effect of suppressing heat generation, 90% or more of the first conductive foil in area ratio provided on the first main surface of light source substrate 20 may be constituted by power supply pattern foil 201. In this case, most of the first conductive foil on the first main surface functions as power supply pattern foil 201. Accordingly, a voltage drop in the power supply line further decreases, wherefore further reduction of the initial power supply voltage can be realized. Furthermore, with further reduction of the initial power supply voltage, heat generation (heat loss) from driver elements 22 and driver elements 23 (particularly driver elements 22) further can be suppressed.

While the effect of suppressing heat generation by reducing a voltage drop in the power supply line has been discussed in the foregoing operation example, a similar effect can be achieved when a voltage drop in the ground line is reduced by using base plate 10.

[3-2. Effects and Others]

As described above, the video display device according to this exemplary embodiment includes a liquid crystal display panel, and a light source substrate configured to illuminate the liquid crystal display panel from a rear side of the liquid crystal display panel. The light source substrate includes a plurality of light emitting diodes each of which is provided in corresponding one of areas different from each other in the liquid crystal display panel, and further includes driver elements which drive each of the plurality of light emitting diodes such that light is emitted with luminance corresponding to brightness within a corresponding area of an image in accordance with a control signal. The light source substrate includes a first main surface on which the light emitting diodes are provided, and a second main surface on a side opposite to the first main surface. First conductive foil is disposed on the first main surface, while second conductive foil is disposed on the second main surface. Ground pattern foil is disposed as the second conductive foil on the second main surface in regions each of which includes a corresponding one of the plurality of light emitting diodes in a plan view. The first conductive foil and the second conductive foil have a substantially equivalent area.

In addition, the video display device according to this exemplary embodiment includes a liquid crystal display panel, a base plate made of metal, and a light source substrate fixed to the base plate and configured to illuminate the liquid crystal display panel from a rear side of the liquid crystal display panel. The light source substrate includes a plurality of light emitting diodes each of which is provided in a corresponding one of areas different from each other in the liquid crystal display panel, and further includes driver elements which drive each of the plurality of light emitting diodes such that light is emitted with luminance corresponding to brightness within a corresponding area of an image in accordance with a control signal. The light source substrate includes a first main surface on which the light emitting diodes are provided, and a second main surface on a side opposite to the first main surface. First conductive foil is disposed on the first main surface, while second conductive foil is disposed on the second main surface. At least a part of the second conductive foil is constituted by ground pattern foil electrically connected to the base plate.

Note that video display device 1 is presented as an example of a video display device. Liquid crystal display panel 70 is presented as an example of the liquid crystal display panel. Each of light source substrates 20 and light source substrates 20a through 20g is presented as an example of the light source substrate. LEDs 21 are presented as an example of the light emitting diodes. Each of driver elements 22 and driver elements 23 is presented as an example of the driver elements. Region A is an example of the region including the corresponding light emitting diode. Ground pattern foil 202 is an example of the ground pattern foil. Base plate 10 is an example of the base plate.

For example, video display device 1 according to the example presented in this exemplary embodiment includes liquid crystal display panel 70, and light source substrate 20 configured to illuminate liquid crystal display panel 70 from a rear side of liquid crystal display panel 70. Light source substrate 20 includes a plurality of LEDs 21 each of which is provided in corresponding one of areas different from each other in liquid crystal display panel 70, and further includes driver elements 22 and driver elements 23 which drive each of the plurality of LEDs 21 such that light is emitted with luminance corresponding to brightness within a corresponding area of an image in accordance with a control signal. Light source substrate 20 includes a first main surface on which LEDs 21 are provided, and a second main surface on a side opposite to the first main surface. First conductive foil is disposed on the first main surface, while second conductive foil is disposed on the second main surface. Ground pattern foil 202 is disposed as the second conductive foil on the second main surface in regions each of which includes a corresponding one of the plurality of LEDs 21 in a plan view. The first conductive foil and the second conductive foil have a substantially equivalent area.

Alternatively, the video display device according to this exemplary embodiment includes liquid crystal display panel 70, base plate 10 made of metal, and light source substrate 20 fixed to base plate 10 and configured to illuminate liquid crystal display panel 70 from a rear side of liquid crystal display panel 70. Light source substrate 20 includes a plurality of LEDs 21 each of which is provided in a corresponding one of areas different from each other in liquid crystal display panel 70, and further includes driver elements 22 and driver elements 23 which drive each of the plurality of LEDs 21 such that light is emitted with luminance corresponding to brightness within a corresponding area of an image in accordance with a control signal. Light source substrate 20 includes a first main surface on which LEDs 21 are provided, and a second main surface on a side opposite to the first main surface. First conductive foil is disposed on the first main surface, while second conductive foil is disposed on the second main surface. At least a part of the second conductive foil is constituted by ground pattern foil 202 electrically connected to base plate 10.

According to the light source substrate of the video display device, 90% or more of the first conductive foil in an area ratio may be constituted by power supply pattern foil.

The light source substrate of the video display device may be fixed to the base plate via a fastening member made of metal. The ground pattern foil may be electrically connected to the base plate via the fastening member.

Note that the screws penetrating screw holes 25 to fix light source substrate 20 to base plate 10 are presented as an example of the fastening member made of metal.

The light source substrate of the video display device may include a plurality of power source connectors electrically connected to the first conductive foil at positions different from each other.

Power input connector 28a, power input connector 28b, power output connector 29a, and power output connector 29b are presented as an example of the plurality of power source connectors.

In the light source substrate of the video display device, the ground pattern foil may be provided as the second conductive foil on the second main surface in regions each of which includes corresponding one of the plurality of light emitting diodes in a plan view. The first conductive foil and the second conductive foil may have a substantially equivalent area.

In the light source substrate of the video display device, the driver elements may be provided on the first main surface.

According to light source substrate 20 included in video display device 1 having the foregoing configuration, an initial power supply voltage can be relatively low by use of either one or both of the power supply line constituted by power supply pattern foil 201 having a large area, and the ground line constituted by base plate 10. Accordingly, heat generation from driver elements 22 and driver elements 23 can be suppressed.

For more securely increasing the effect of suppressing heat generation, 90% or more of the first conductive foil in area ratio provided on the first main surface of light source substrate 20 may be power supply pattern foil. In this case, most of the first conductive foil on the first main surface functions as the power supply pattern foil. Accordingly, a voltage drop in the power supply line further decreases, wherefore further reduction of the power supply voltage for driving LEDs 21 can be realized. Moreover, heat generation (heat loss) of driver elements 22 and driver elements 23 can be suppressed with reduction of the power supply voltage.

Other Exemplary Embodiments

The first through third exemplary embodiments have been described by way of example of the technology disclosed according to the present application. The accompanying drawings and detailed description have been presented for this purpose.

Accordingly, for presentation of examples of the technology, constituent elements shown in the accompanying drawings and detailed description may contain not only constituent elements essential for solving problems, but also constituent elements not essential for solving problems. It should not be therefore directly determined that the constituent elements which are not essential elements are essential based on the consideration that these constituent elements are included in the accompanying drawings and detailed description.

Moreover, the exemplary embodiments described above are presented as examples of the technology of the present disclosure, wherefore various modifications, replacements, additions, omissions and the like may be made within the scope of the claims and an equivalent range. In addition, a different exemplary embodiment may be produced by combining respective constituent elements described in the first through third exemplary embodiments.

Note that errors and variations in positions, shapes and the like of respective members included in the foregoing description are allowed as long as intended advantageous effects are offered.

INDUSTRIAL APPLICABILITY

The present disclosure is applicable to a video display device. More specifically, the present disclosure is applicable to a television receiver, an image recording and reproducing device, a computer display device, and others.

REFERENCE MARKS IN THE DRAWINGS

1: video display device
1a: housing
10: base plate
11, 12: reinforcing beam
13, 13a: opening
14, 15: cable
20, 20a, 20b, 20c, 20d, 20e, 20f, 20g, 210: light source substrate
21: LED
22, 23: driver element
24: opening
25: screw hole
26a, 26b: signal input connector
27a, 27b: signal output connector
28a, 28b: power input connector
29a, 29b: power output connector
30: reflection sheet
31: protrusion
32, 33: opening
35: adhesive tape
36: support pin
40: flatter
41, 41a: hole
50: optical sheet
60: mold frame
70: liquid crystal display panel
71: area
80: bezel
91: connection terminal substrate
92: signal processing substrate
93: power supply substrate
200: substrate
201, 211: power supply pattern foil
202: ground pattern foil
203: signal pattern foil

The invention claimed is:
1. A video display device comprising:
a liquid crystal display panel; and
a light source configured to illuminate the liquid crystal display panel from a rear side of the liquid crystal display panel, wherein:
the light source includes:
a substrate having a first main surface and a second main surface opposite to the first main surface;
a plurality of light emitting diodes disposed on the first main surface of the substrate, each of which is disposed in corresponding one of areas different from each other in the liquid crystal display panel;
driver elements which are configured to drive each of the plurality of light emitting diodes such that light is emitted with luminance corresponding to brightness within a corresponding area of an image in accordance with a control signal;
first conductive foil disposed on the first main surface of the substrate; and
second conductive foil disposed on the second main surface of the substrate,
ground pattern foil is disposed as the second conductive foil on the second main surface in regions each of which includes a corresponding one of the plurality of light emitting diodes in a plan view, and
wherein the second conductive foil only partially covers the second main surface of the substrate.
2. The video display device according to claim 1, wherein the driver elements are provided on the first main surface.
3. The video display device according to claim 1, wherein the first conductive foil and the second conductive foil have an equivalent area.
4. The video display device according to claim 1, wherein the light source is disposed on the rear side of the liquid crystal display panel.
5. The video display device according to claim 1, wherein the first main surface of the light source faces a rear main surface of the liquid crystal display panel.
6. The video display device according to claim 1, wherein when viewed along a normal direction of a main face of the liquid crystal display panel, the light source overlaps the liquid crystal display panel.
7. A video display device comprising:
a liquid crystal display panel;
a base plate made of metal; and
a light source fixed to the base plate and configured to illuminate the liquid crystal display panel from a rear side of the liquid crystal display panel, wherein:
the light source includes:
a substrate having a first main surface and a second main surface opposite to the first main surface;
a plurality of light emitting diodes disposed on the first main surface of the substrate, each of which is disposed in a corresponding one of areas different from each other in the liquid crystal display panel;
driver elements which are configured to drive each of the plurality of light emitting diodes such that light is emitted with luminance corresponding to brightness within a corresponding area of an image in accordance with a control signal;
first conductive foil disposed on the first main surface of the substrate; and
second conductive foil disposed on the second main surface of the substrate,
the second conductive foil only partially covers the second main surface of the substrate, and
at least a part of the second conductive foil is constituted by ground pattern foil electrically connected to the base plate.
8. The video display device according to claim 7, wherein 90% or more of the first conductive foil in an area ratio is constituted by power supply pattern foil.

9. The video display device according to claim 7, wherein
the light source is fixed to the base plate via a fastening member made of metal, and
the ground pattern foil is electrically connected to the base plate via the fastening member.

10. The video display device according to claim 7, wherein
the light source includes a plurality of power source connectors connected to the first conductive foil at positions different from each other.

11. The video display device according to claim 7, wherein
the ground pattern foil is disposed as the second conductive foil on the second main surface in regions each of which includes corresponding one of the plurality of light emitting diodes in a plan view, and
the first conductive foil and the second conductive foil have an equivalent area.

12. The video display device according to claim 7, wherein
the driver elements are provided on the first main surface.

13. The video display device according to claim 7, wherein
the light source is disposed on the rear side of the liquid crystal display panel.

14. A video display device comprising:
a liquid crystal display panel; and
a light source configured to illuminate the liquid crystal display panel from a rear side of the liquid crystal display panel, wherein:
the light source includes:
a substrate having a first main surface and a second main surface opposite to the first main surface;
a plurality of light emitting diodes disposed on the first main surface of the substrate, each of which is disposed in corresponding one of areas different from each other in the liquid crystal display panel;
driver elements which are configured to drive each of the plurality of light emitting diodes such that light is emitted with luminance corresponding to brightness within a corresponding area of an image in accordance with a control signal;
first conductive foil disposed on the first main surface of the substrate; and
second conductive foil disposed on the second main surface of the substrate,
ground pattern foil is disposed as the second conductive foil on the second main surface in regions each of which includes a corresponding one of the plurality of light emitting diodes in a plan view, and
when view along a normal direction of a main face of the liquid crystal display panel, the light source overlaps the liquid crystal display panel,
wherein the second conductive foil only partially covers the second main surface of the substrate.

15. The video display device according to claim 14, wherein
the first conductive foil and the second conductive foil have an equivalent area.

* * * * *